(12) United States Patent
Futamura et al.

(10) Patent No.: US 8,106,988 B2
(45) Date of Patent: Jan. 31, 2012

(54) SOLID IMAGING DEVICE

(75) Inventors: Fumiaki Futamura, Kanagawa (JP);
Tetsuji Kimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 729 days.

(21) Appl. No.: 12/204,912

(22) Filed: Sep. 5, 2008

(65) Prior Publication Data

US 2009/0066828 A1    Mar. 12, 2009

(30) Foreign Application Priority Data

Sep. 6, 2007 (JP) ................. 2007-231921
Jul. 9, 2008 (JP) ................. 2008-179597

(51) Int. Cl.
*H04N 3/14* (2006.01)
*H04N 5/335* (2011.01)

(52) U.S. Cl. ........................ 348/311; 348/321

(58) Field of Classification Search .............. 348/311, 348/321, 323
See application file for complete search history.

(56) References Cited

U.S. PATENT DOCUMENTS

| 4,837,630 A * | 6/1989 | Ueda ............... 348/319 |
| 5,867,215 A * | 2/1999 | Kaplan ............ 348/315 |
| 7,595,517 B2 * | 9/2009 | Ikeda ............. 257/215 |

FOREIGN PATENT DOCUMENTS

| CN | 1684270 | 10/2005 |
| JP | 8-205034 | 8/1996 |
| JP | 2007-27456 | 2/2007 |

OTHER PUBLICATIONS

Chinese Office Action for Application No. 200810213478.7 With English Translation, Date Issued on Feb. 22, 2011.

* cited by examiner

*Primary Examiner* — Alicia M Harrington
(74) *Attorney, Agent, or Firm* — Young & Thompson

(57) ABSTRACT

In a solid imaging device, a photoelectric converting section is configured to generate electric charges through photoelectric conversion, and a first charge transfer section is connected with the photoelectric converting section. A first read gate section is provided between the photoelectric converting section and the first charge transfer section, and is configured to transfer the electric charges from the photoelectric converting section to the first charge transfer section. A second charge transfer section operates independently from the first charge transfer section and configured to receive the electric charges transferred from the first charge transfer section.

20 Claims, 47 Drawing Sheets

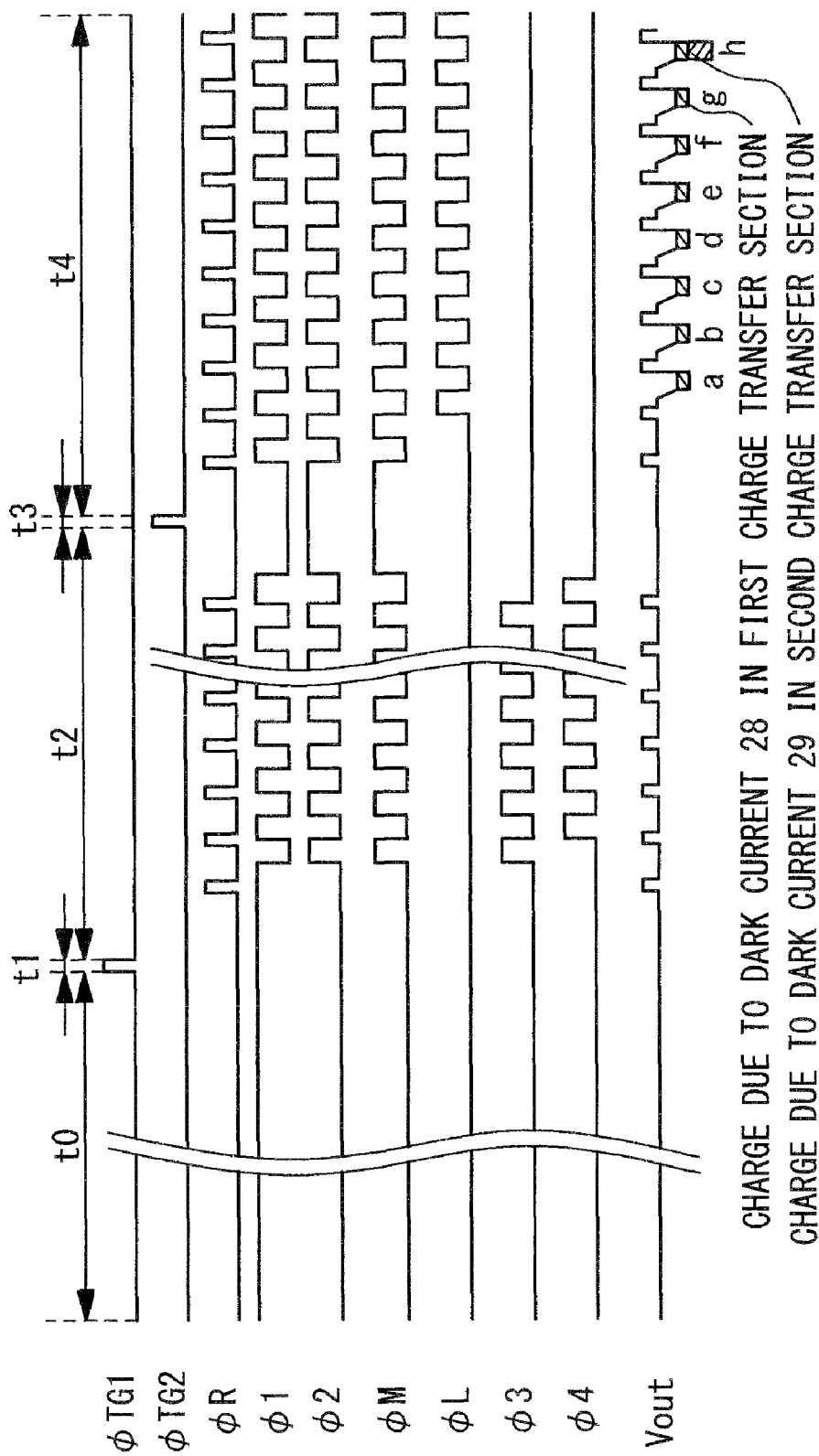

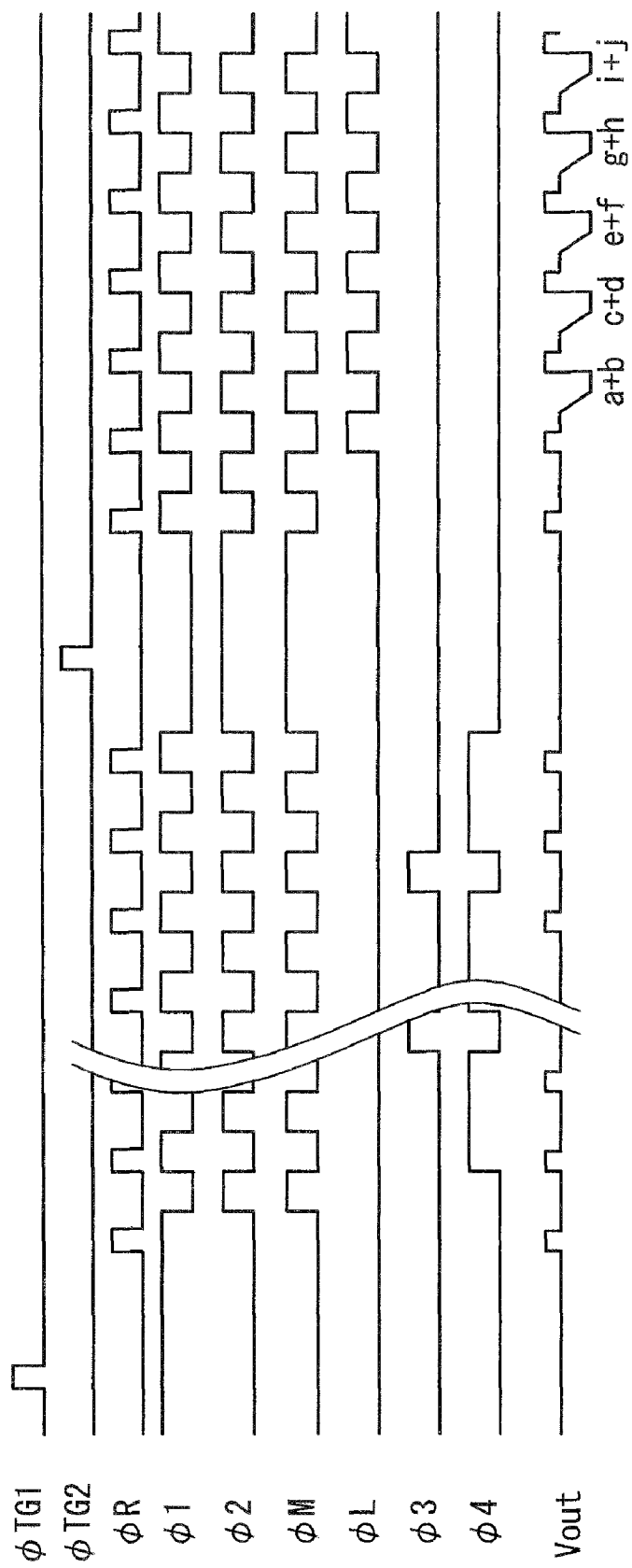

US 8,106,988 B2

SOLID IMAGING DEVICE

INCORPORATION BY REFERENCE

This application claims priorities on convention based on Japanese Patent Application Nos. 2007-231921 and 2008-179597. The disclosures thereof are incorporated herein by reference.

BACKGROUND OF THE INVENTION

1. Field of the Invention

The present invention relates to a solid imaging device and a driving method for the same.

2. Description of Related Art

A solid imaging device used to pick up an image in a scanner has pixels for a number corresponding to a maximum resolution. The resolution is reduced by combining adjacent pixels to a low resolution, thereby shortening an accumulation time.

FIG. 1 is a diagram illustrating a first example of a conventional solid imaging device. This solid imaging device includes photodiodes (i.e., photoelectric converting section) 1 for performing photoelectric conversion, a read gate electrode 20 for sending electric charges (CHG) obtained through the photoelectric conversion to a transfer electrode 21, a capacitance (Cfj) section 19 for converting the transferred electric charge into a voltage, an amplifier 13 for amplifying the voltage, and a reset gate 12 for drawing out the electric charge accumulated in the floating diffusion capacitance section 19 to a reset drain 11. Here, the transfer electrode 21 and a transfer electrode 22 constitute an electric charge transfer section.

FIGS. 2A to 2C illustrate an electric charge transferring process. Here, electric charges 23 are transferred from the photodiodes (i.e., photoelectric converting section) 1 to the transfer electrode 21 through the read gate electrode 20 from FIG. 2A to FIG. 2B, and thereafter, the electric charge 23 is transferred from the transfer electrode 21 to the transfer electrode 22 from FIG. 2B to FIG. 2C.

FIG. 3 is timing charts illustrating standard timings at which the charges in all of pixels are outputted. FIG. 4 illustrates timings in a low resolution drive in case of coupling the charges in four pixels. Here, a resolution is one fourth of a standard resolution. The frequency of a transfer clock signal in the electric charge transfer section is quadruple of that of the standard clock signal in order to make a data rate equal to that at the standard timings illustrated in FIG. 3. At this time, the coupling of the charges in the four pixels is performed in the floating diffusion capacitance section 19.

Referring to FIGS. 3 and 4, a transfer gate clock signal $\phi_{TG}$ is supplied to the read gate electrode 20. A reset clock signal $\phi_R$ is supplied to the reset gate 12. A drive clock signal $\phi_1$ is supplied to the transfer electrode 21, and a drive clock signal $\phi_2$ is supplied to the transfer electrode 22. Vout denotes an output of the amplifier 13.

FIG. 5 is a diagram illustrating a second example of a conventional solid imaging device. This solid imaging device includes photodiodes (i.e., a photoelectric converting section) 1 for performing photoelectric conversion, a read gate electrode 26 for sending an electric charge obtained through the photoelectric conversion to memory regions (i.e., electric charge accumulating sections) 15, a read gate electrode 24 and a read gate electrode 25 for sending the electric charge accumulated in the memory regions 15 to a transfer electrode 21, a floating diffusion capacitance section 19 for converting the transferred electric charge into voltage, the amplifier 13 for amplifying the voltage, and a reset gate 12 for drawing out the electric charge accumulated in the floating diffusion capacitance section 19 to a reset drain 11. Here, a pair of the transfer electrodes (i.e., the transfer electrode 21 and the transfer electrode 22) is assigned to two photodiodes 1 in the photoelectric converting section. Therefore, since the number of the transfer electrodes is less by a half when all of signals are outputted, a read operation is performed twice.

In this case, the charges in odd-numbered pixels are first transferred, and then the charges in even-numbered pixels are transferred, as illustrated in FIGS. 6A to 6G. The transfer timings at that time are illustrated in FIG. 7. In FIGS. 6A and 6B, the electric charges a to h are transferred from the photodiodes 1 in a photoelectric converting section to the memory regions 15 via the gate electrode 26. In FIGS. 6B and 6C, the electric charges a, c, e and g are transferred from the memory regions 15 to the transfer electrodes 21 via the gate electrodes 24. In FIGS. 6C and 6D, the electric charge a is transferred from the transfer electrode 21 to the adjacent floating diffusion capacitance section 19, and further the electric charges c, e and g are transferred from the transfer electrodes 21 to the adjacent transfer electrodes 22 on the side of the floating diffusion capacitance section 19. The above-described transfer is repeated until all of the electric charges a, c, e and g are drawn to the reset drain 11, as illustrated in FIG. 6E. In FIGS. 6E and 6F, the electric charges b, d, f and h are transferred from the memory regions 15 to the transfer electrodes 21 via the gate electrodes 25. In FIGS. 6F and 6G, the electric charge b is transferred from the transfer electrode 21 to the adjacent floating diffusion capacitance section 19, and further the electric charges d, f and h are transferred from the transfer electrodes 21 to the adjacent transfer electrodes 22 on the side of the floating diffusion capacitance section 19. Hereinafter, the above-described transfer is repeated until all of the electric charges b, d, f and h are drawn to the reset drain 11.

An advantage of this structure is in that in case of 2-pixel coupling, electric charges can be coupled on each transfer electrode 21 by turning on the read gate electrodes 24 and the read gate electrodes 25 at a same time. As a result, a same data rate as that of the standard timings can be achieved without increasing the frequencies of the clock signals applied to the transfer electrodes 21 and the transfer electrodes 22. Such timings are illustrated in FIG. 8. The frequencies of the clock signals needs to be increased in case of coupling the charges in 4 or more pixels, and such timings are illustrated in FIG. 9.

Referring to FIGS. 7 to 9, a reset pulse $\phi_R$ is supplied to the reset gate 12. A drive clock signal $\phi_1$ is supplied to the transfer electrode 21, and a drive clock signal $\phi_2$ is supplied to the transfer electrode 22. A transfer gate clock signal $\phi_{TG1}$ is supplied to the read gate electrode 26. A transfer gate clock signal $\phi_{TG2-1}$ is supplied to the read gate electrode 24, and a transfer gate clock signal $\phi_{TG2-2}$ is supplied to the read gate electrode 25. Vout denotes an output from the amplifier 13.

Although a mount of charges equal to an amount of charges in high resolution can be accumulated in a short period of time by coupling electric charges of adjacent pixels even at reduced resolutions, the data rate is decreased unless a transfer speed is increased. As a result, the transfer speed is doubled every time the resolution is halved in the first example of the solid imaging device. As a consequence, a high-frequency clock signal is needed in the system. High-frequency noise is generated more easily which causes EMI (electro magnet interference).

The same problem is caused in FIG. 5 when the resolution is gradually decreased. If the problem is intentional to be eliminated by increasing the number of photodiodes, an output order of data in each of resolutions becomes complicated, thereby raising another problem of the increase in the number of read gates.

In conjunction with the above description, an imaging device is disclosed in Japanese Patent Application Publication No. (JP-P2007-027456A). This imaging device includes a plurality of pixels aligned in one line, a read gate adjacent to the plurality of pixels, memory gates disposed in correspondence to the plurality of pixels adjacently to the read gate, memory control gates disposed in correspondence to the memory gates, and a CCD (charge coupled device) accumulating gate disposed commonly to the plurality of memory control gates.

Also, Japanese Patent Application Publication (JP-A-Heisei 8-205034) discloses a technique to temporarily save electric charges staying heretofore in a horizontal electric charge transfer section or a vertical electric charge transfer section so as to rapidly read arbitrary electric charge data. For example, the horizontal electric charge transfer section includes a first electric charge transfer section for accumulating electric charge held in the vertical electric charge transfer section and a second electric charge transfer section for accumulating the electric charge held in the first electric charge transfer section, and the electric charges are circulated in a ring manner at a constant speed between the first and second electric charge transfer sections. However, the first and second electric charge transfer sections are driven in association with each other. In other words, a same clock signal is supplied to both of the first and second electric charge transfer sections, and therefore, they cannot be driven at different timings or in different cycles.

SUMMARY

In an aspect of the present invention, a solid imaging device includes a photoelectric converting section configured to generate electric charges through photoelectric conversion, a first charge transfer section connected with the photoelectric converting section; a first read gate section provided between the photoelectric converting section and the first charge transfer section, and configured to transfer the electric charges from the photoelectric converting section to the first charge transfer section; and a second charge transfer section operating independently from the first charge transfer section and configured to receive the electric charges transferred from the first charge transfer section.

Also, in another aspect of the present invention, a solid imaging apparatus includes a plurality of the above solid imaging devices.

According to the present invention, electric charges can be outputted at the same data rate at any resolutions, thus facilitating sampling. In particular, effects can be exhibited in a system using a plurality of chips such as CIS.

BRIEF DESCRIPTION OF THE DRAWINGS

The above and other objects, advantages and features of the present invention will be more apparent from the following description of certain embodiments taken in conjunction with the accompanying drawings, in which:

FIG. 26 shows timing charts in an operation example when electric charges corresponding to a dark current are added in the first embodiment;

FIG. 32 shows timing charts in a standard operation when electric charge coupling electrodes are replaced with a transfer electrodes.

DESCRIPTION OF THE PREFERRED EMBODIMENTS

Hereinafter, a solid imaging device of the present invention will be described in detail with reference to the attached drawings.

First Embodiment

Figure 10:
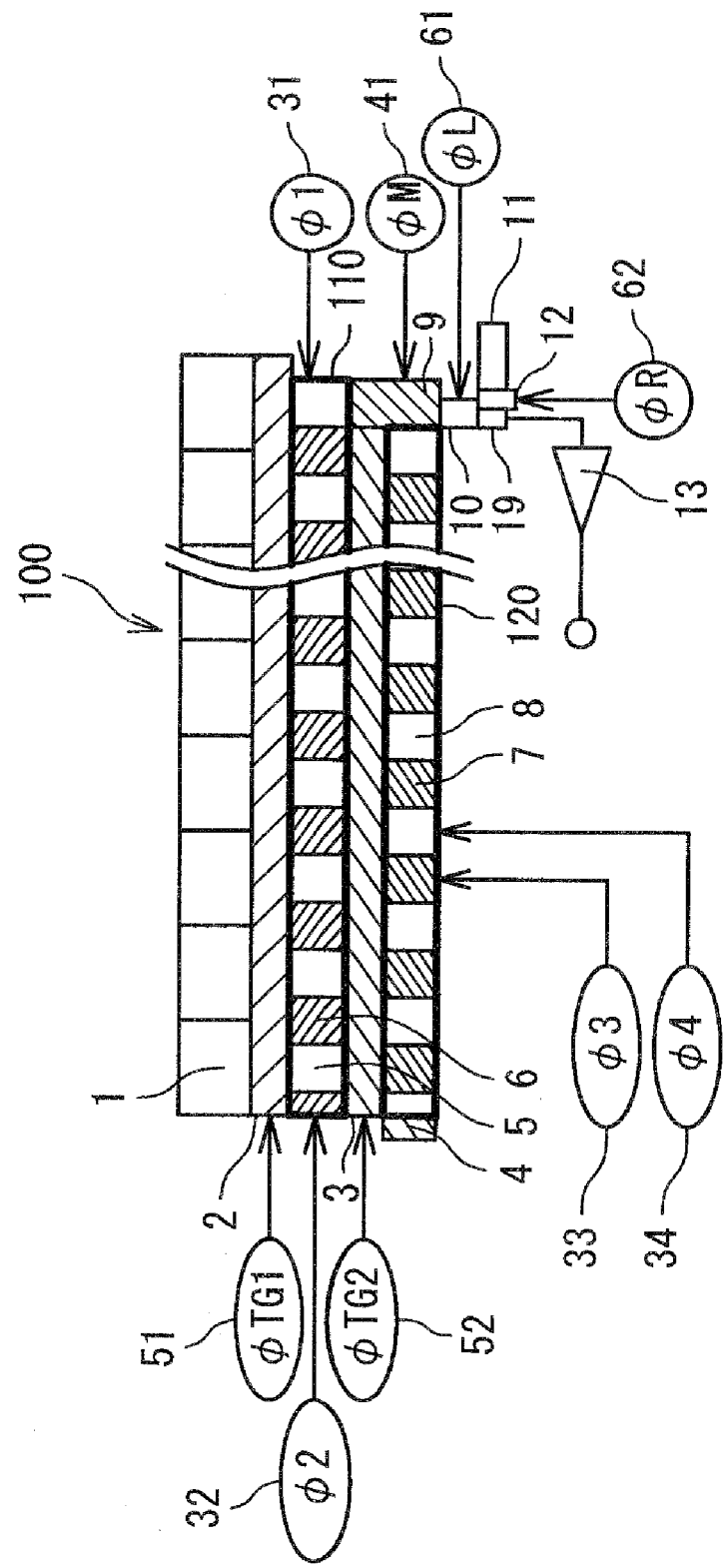
FIG. 10 is a diagram showing a configuration of a solid imaging device according to a first embodiment of the present invention.

Referring to FIG. 10, a solid imaging device 100 according to a first embodiment of the present invention will be described. The solid imaging device 100 in the first embodiment includes photodiodes 1 in a photoelectric converting section, a read gate electrode 2, a read gate electrode 3, an overflow drain section 4, transfer electrodes 5, transfer electrodes 6, transfer electrodes 7, transfer electrodes 8, an electric charge coupling electrode 9, a last gate electrode 10, a reset drain 11, a reset gate 12, an amplifier 13 and a floating diffusion capacitance section 19.

The photodiodes 1 perform photoelectric conversion to convert light into an electric charge. The read gate electrode 2 sends the electric charges obtained through photoelectric conversion to the transfer electrodes 5. Then, the electric charges are sent to the transfer electrode 8 as will be described later. The read gate electrode 3 sends the electric charges accumulated in the transfer electrodes 8 to the transfer electrodes 6. The electric charges are sent to the electric charge coupling electrode 9. The electric charge coupling electrode 9 sends the electric charge to the floating diffusion capacitance section 19 via the last gate electrode 10. The floating diffusion capacitance section 19 converts the transferred electric charge to a voltage. The amplifier 13 amplifies the voltage to output it. The reset gate 12 draws the electric charge accumulated in the floating diffusion capacitance section 19 to the reset drain 11.

Here, the transfer electrode 5 and the transfer electrode 6 forms a first electric charge transfer section 110. The transfer electrode 7 and the transfer electrode 8 form a second electric charge transfer section 120. The first electric charge transfer section 110 includes the transfer electrodes 5 and the transfer electrodes 6. The second electric charge transfer section 120 includes the transfer electrodes 7 and the transfer electrodes 8.

The read gate electrode 2 is interposed between the photodiodes 1 and the first electric charge transfer section 110. The first electric charge transfer section 110 and the second electric charge transfer section 120 are connected to each other via the read gate electrode 3. The second electric charge transfer section 120 is connected via the electric charge coupling electrode 9 to an output of the first electric charge transfer section 110. Furthermore, the electric charge coupling electrode 9 is connected to the floating diffusion capacitance section 19 via the last gate electrode 10. The floating diffusion capacitance section 19 is connected to the amplifier 13, and the reset drain 11 via the reset gate 12. In the present embodiment, the last gate electrode 10 indicates an output electrode. The amplifier 13 designates an electric charge detecting section.

Here, a clock generating circuit (not shown) supplies a drive clock $\phi_1$ 31 to the transfer electrode 5 in the first electric charge transfer section 110, as illustrated in FIG. 10. Furthermore the clock generating circuit supplies a drive clock signal $\phi_2$ 32 to the transfer electrode 6 in the first electric charge transfer section 110. On the other hand, the clock generating circuit supplies a drive clock signal $\phi_3$ 33 to the transfer electrode 7 in the second electric charge transfer section 120. The clock generating circuit supplies a drive clock signal $\phi_4$ 34 to the transfer electrode 8 in the second electric charge transfer section 120. The clock generating circuit supplies a modulation clock signal $\phi_M$ 41 to the electric charge coupling electrode 9. A selection signal (i.e., a drive switch signal) may be supplied to the clock generating circuit to switch transfer timings based on a current resolution. In this case, each of the drive clock signal $\phi_3$ and the drive clock signal $\phi_4$ uses a clock signal based on the resolution. The clock generating circuit supplies a transfer gate clock signal $\phi_{TG1}$ to the read gate electrode 2. Also, the clock generating circuit supplies a transfer gate clock signal $\phi_{TG2}$ to the read gate electrode 3. The clock generating circuit supplies a last clock signal $\phi_L$ 61 to the last gate electrode 10, and a reset pulse $\phi_R$ 62 to the reset gate 12.

Next, referring to FIGS. 11A to 11E and 12, an example of a standard procedure to transfer electric charges will be described.

Figure 1:
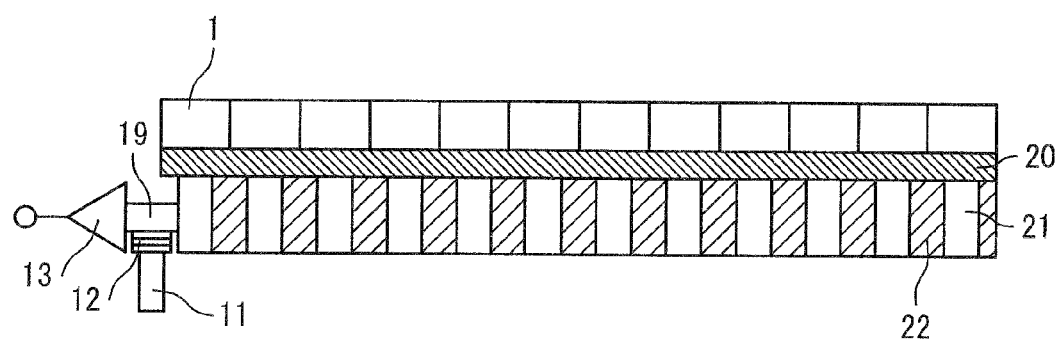
FIG. 1 is a diagram illustrating a conventional solid imaging device in a first example.
Figure 2A:
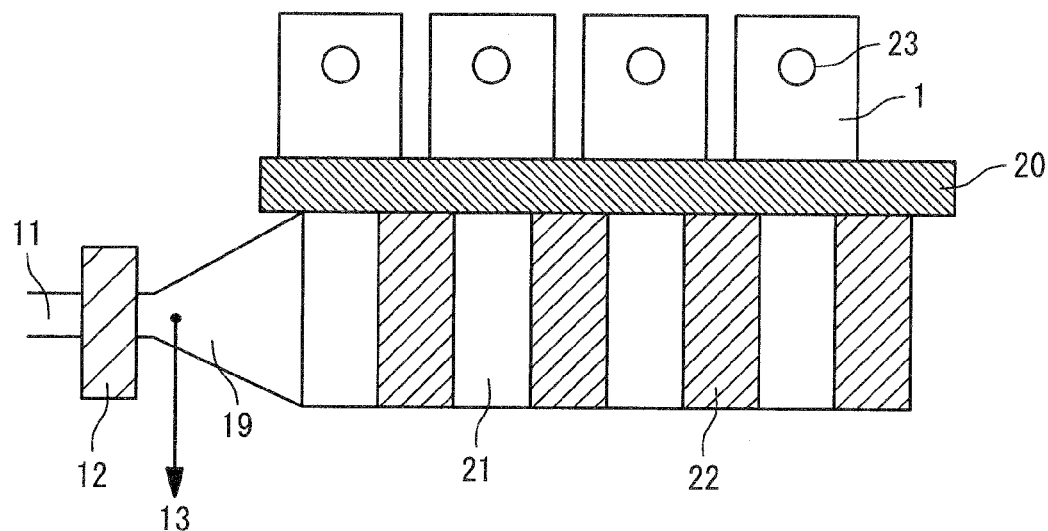
FIGS. 2A to 2C are diagrams illustrating an electric charge transferring process in the conventional solid imaging device in the first example.
Figure 2B:
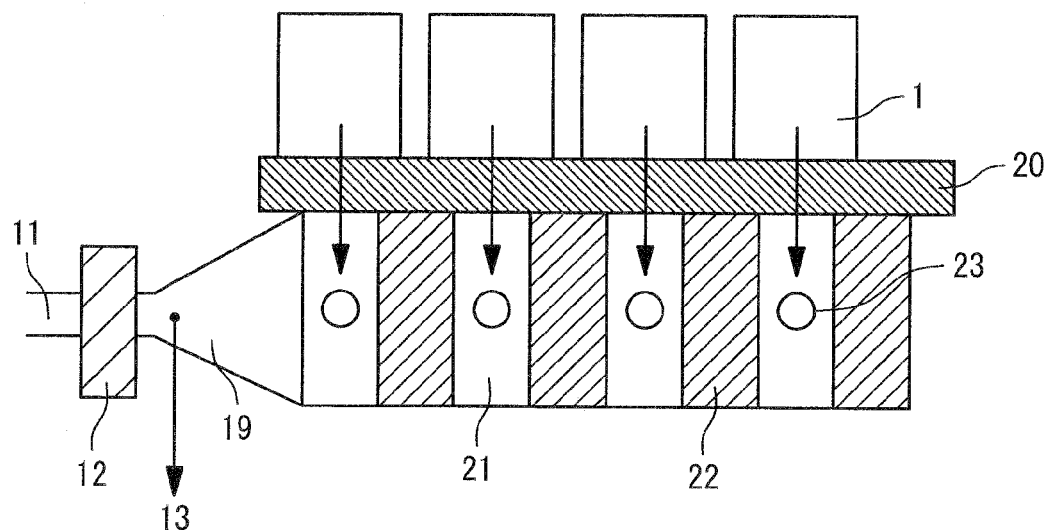
Figure 2C:
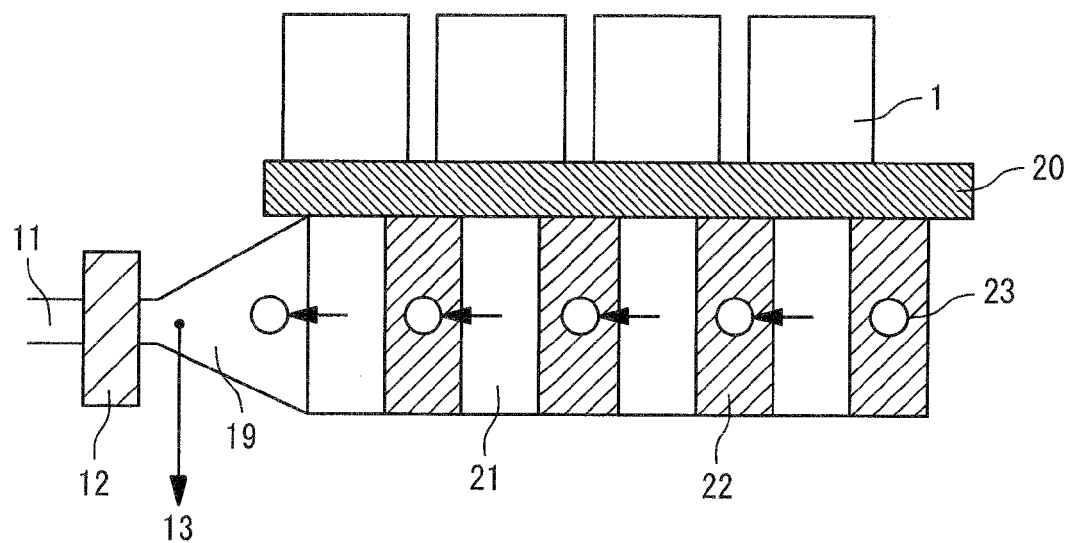
Figure 3:
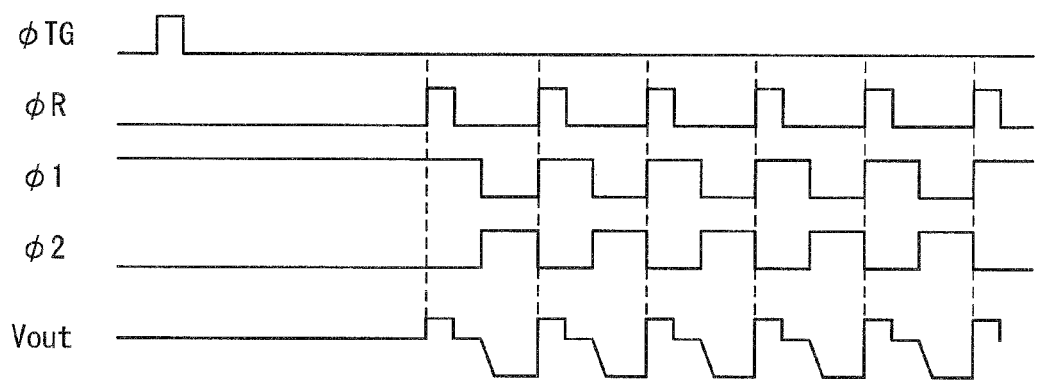
FIG. 3 shows timing charts in a standard timing operation in the conventional solid imaging device in the first example.
Figure 4:
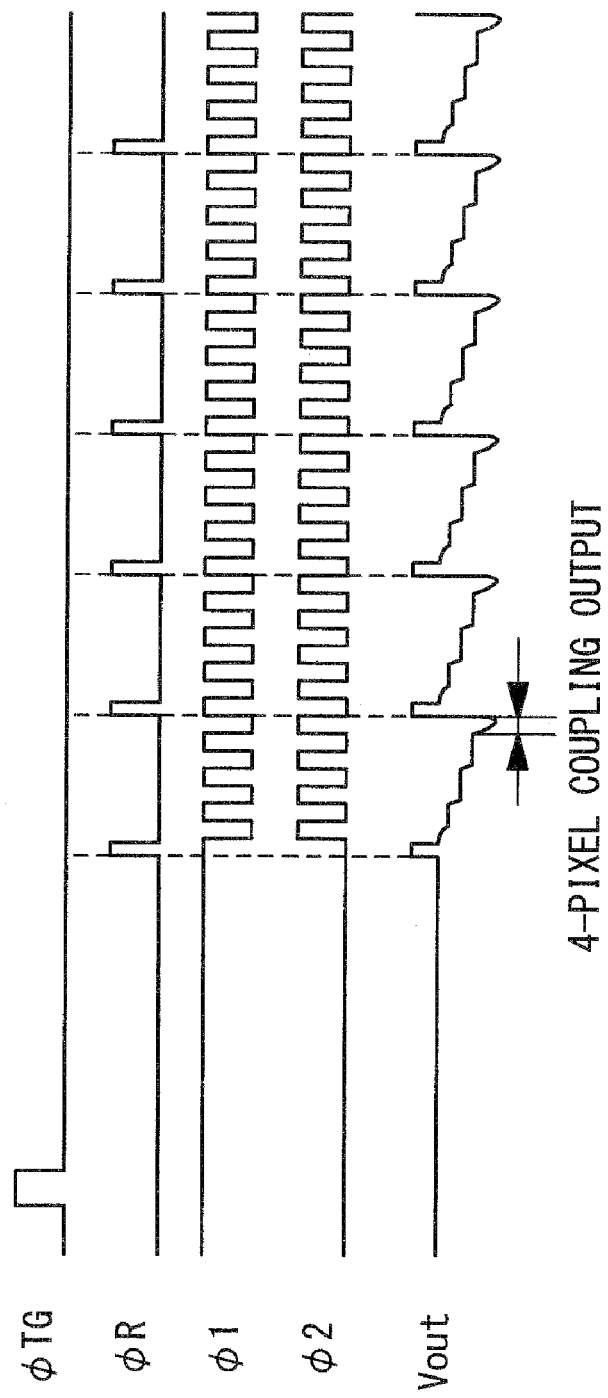
FIG. 4 shows timing charts in a 4-pixel coupling operation in the conventional solid imaging device in the first example.
Figure 5:
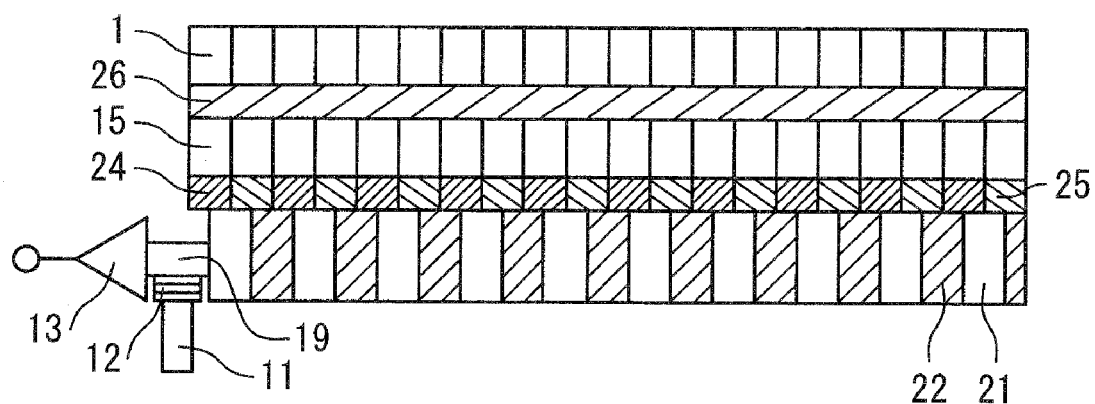
FIG. 5 is a diagram illustrating a conventional solid imaging device in a second example.
Figure 6A:
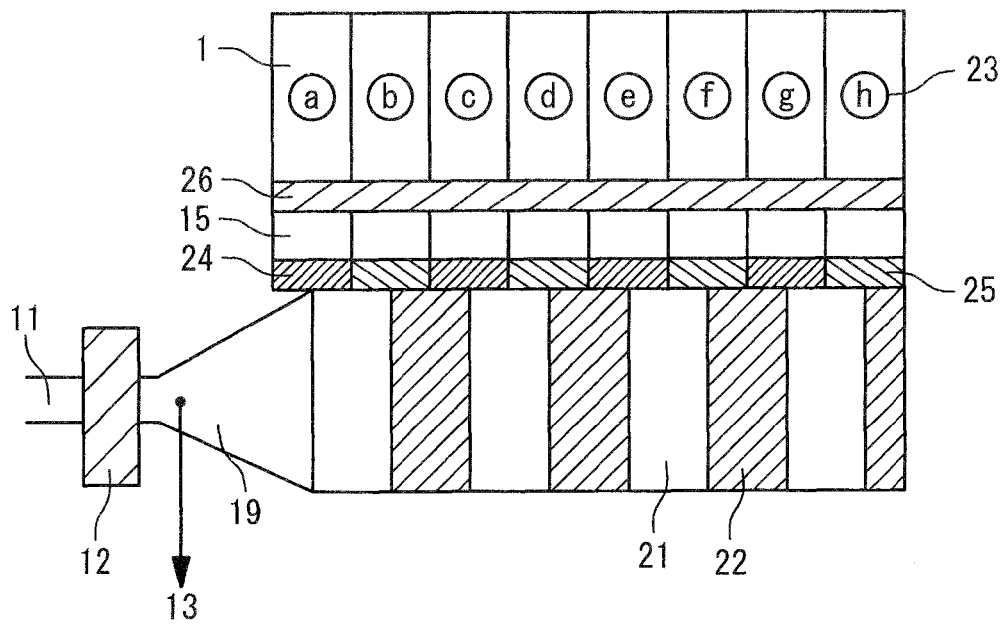
FIGS. 6A to 6G are diagrams illustrating an electric charge transferring process in the conventional solid imaging device in the second example.
Figure 6B:
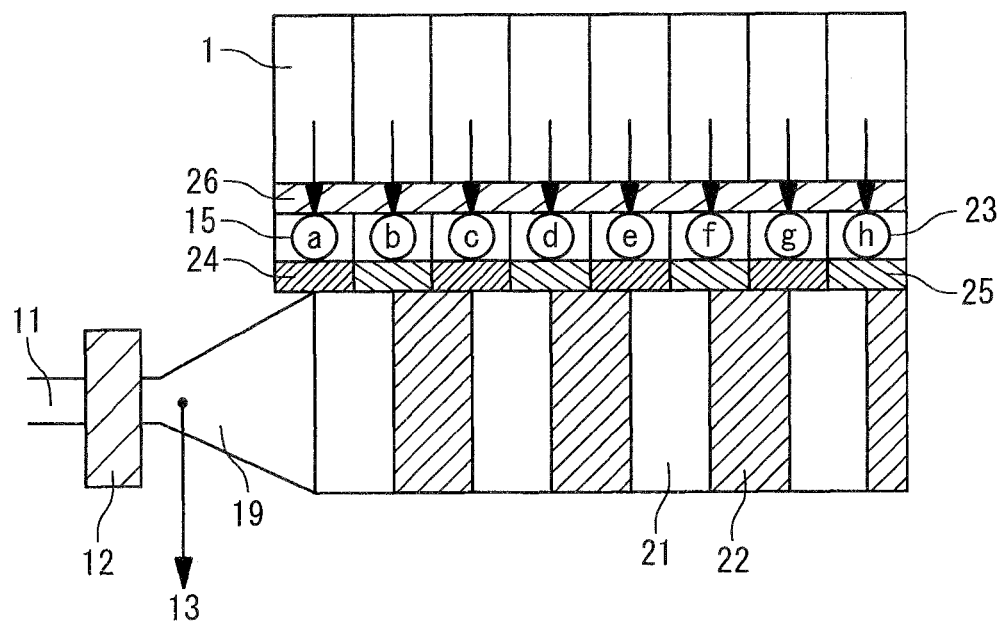
Figure 6C:
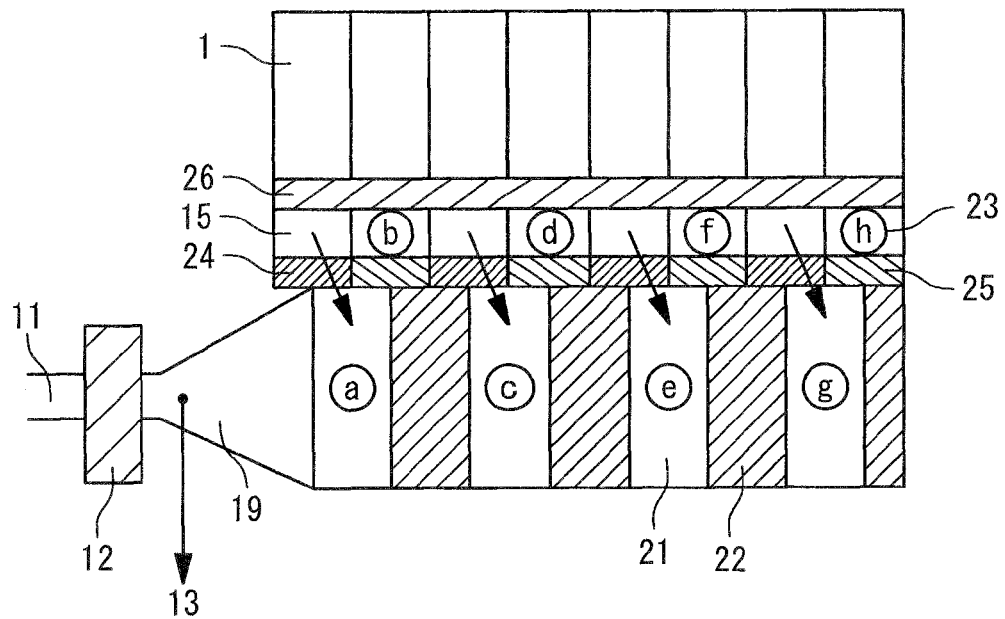
Figure 6D:
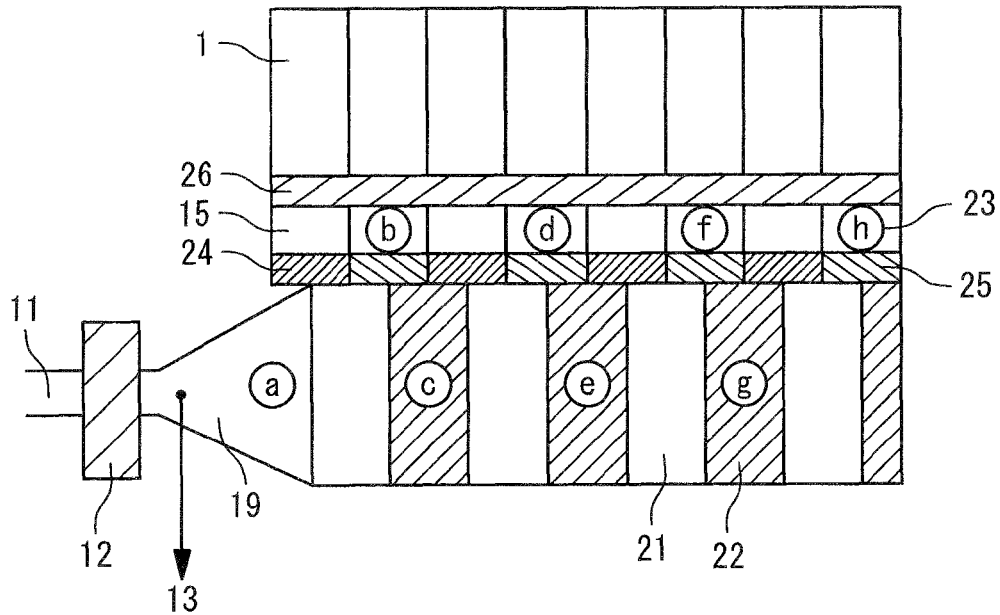
Figure 6E:
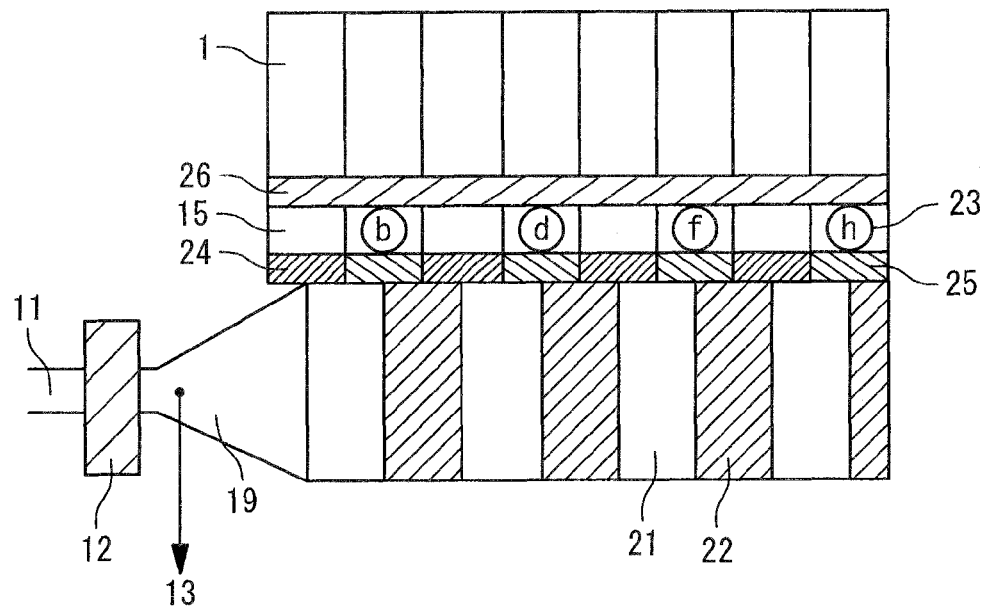
Figure 6F:
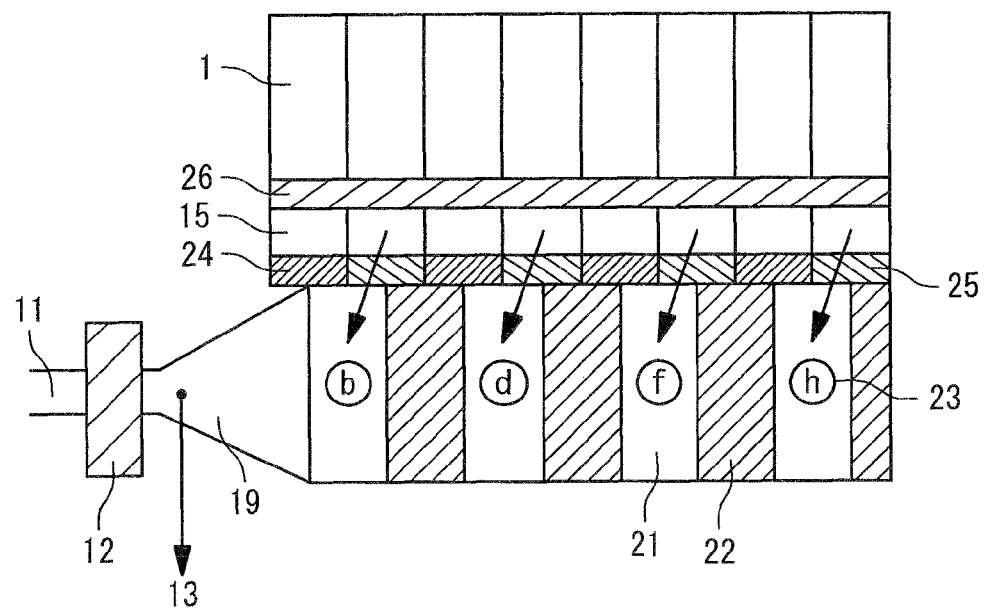
Figure 6G:
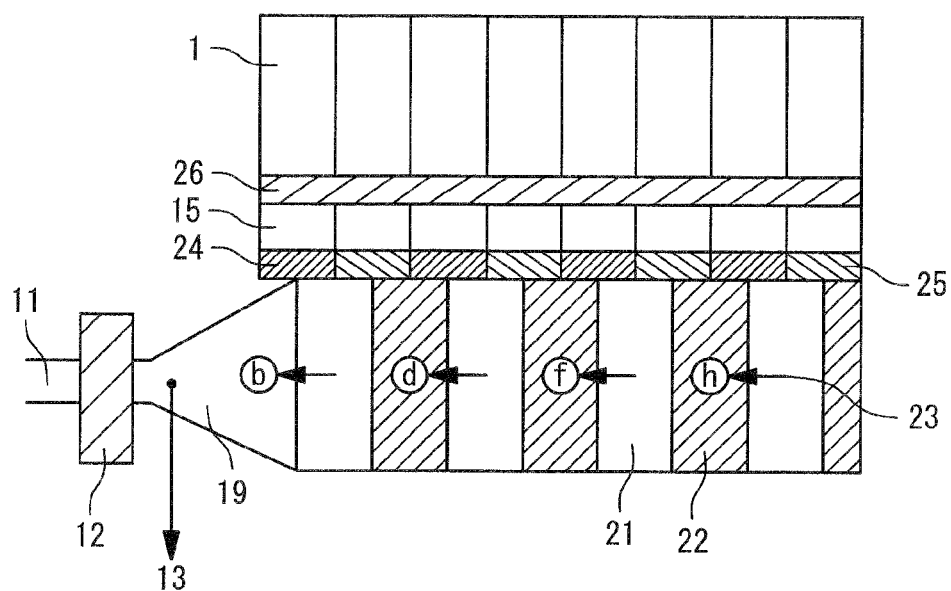
Figure 7:
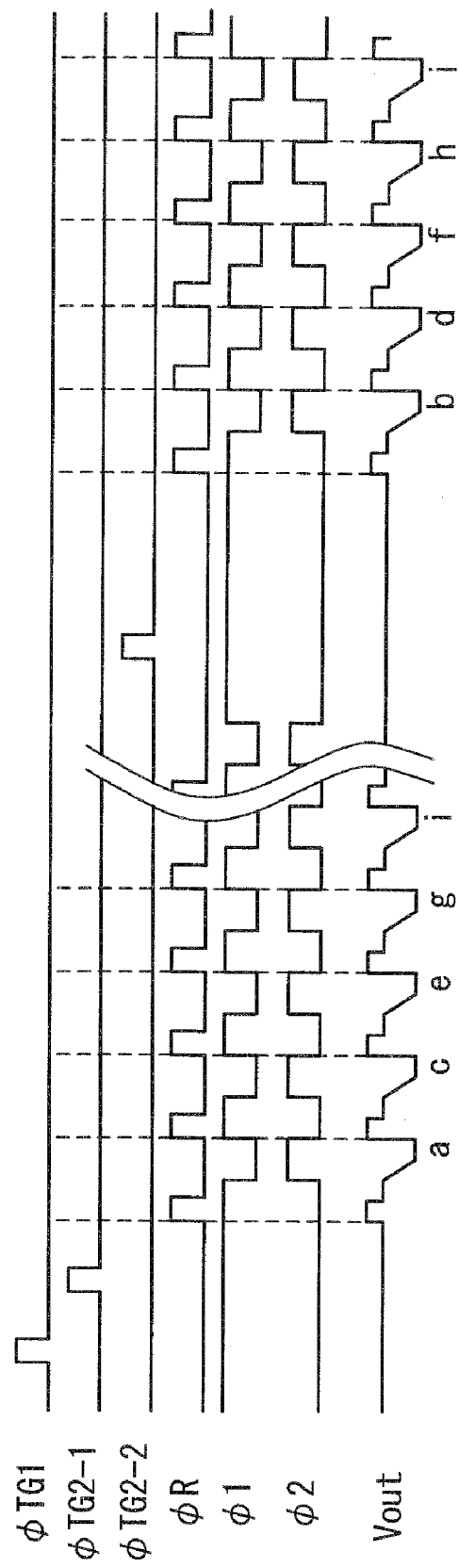
FIG. 7 shows timing charts in a standard operation in the conventional solid imaging device in the second example.
Figure 8:
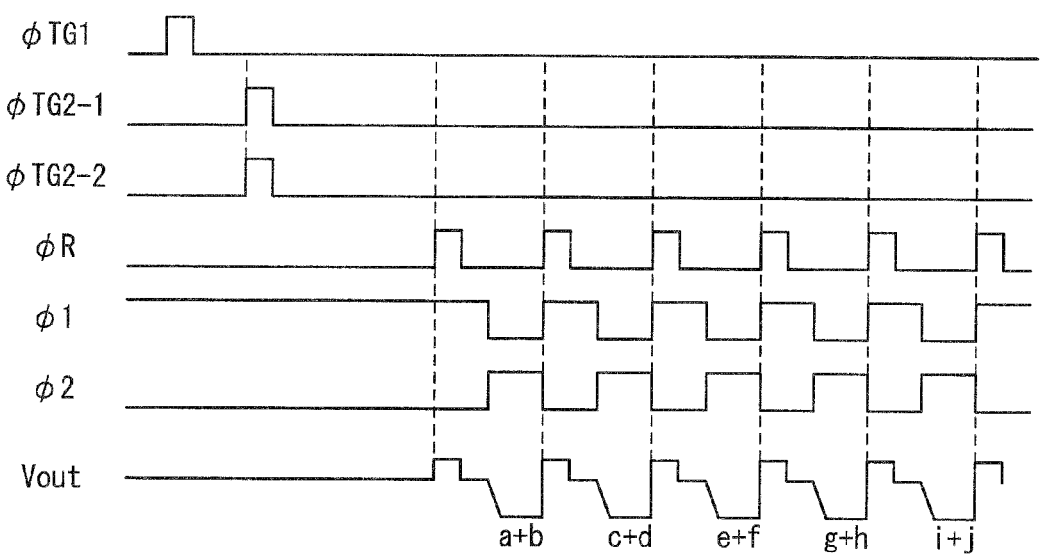
FIG. 8 shows timing charts in a 2-pixel coupling operation in the conventional solid imaging device in the second example.
Figure 9:
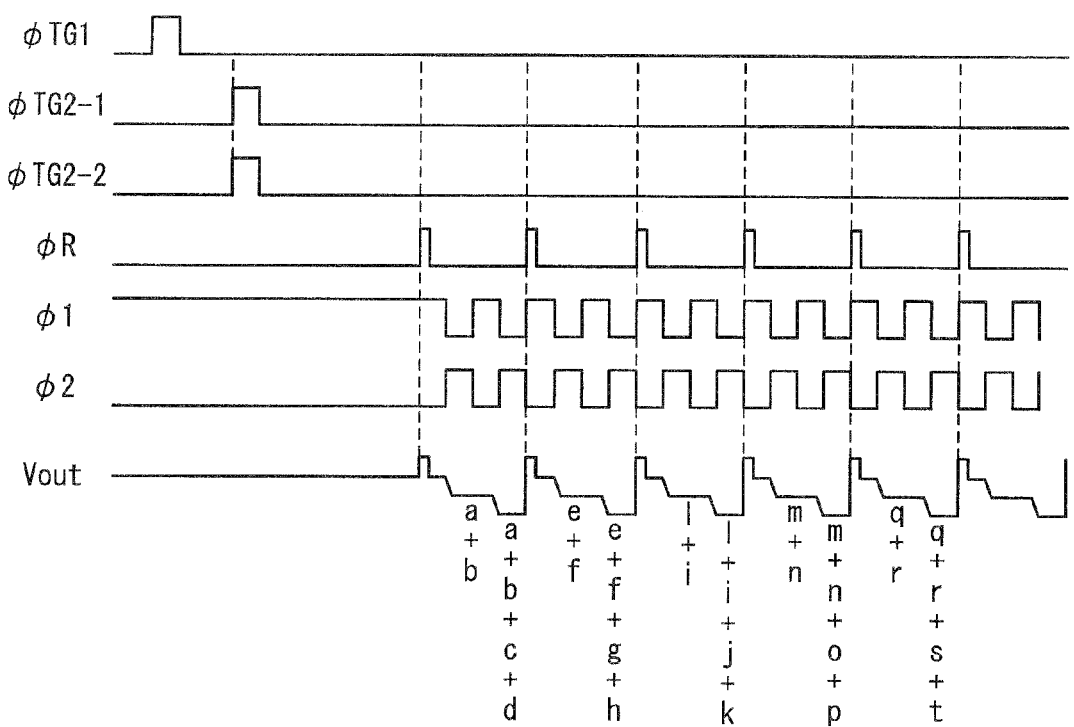
FIG. 9 shows timing charts in a 4-pixel coupling operation in the conventional solid imaging device in the second example.
Figure 11A:
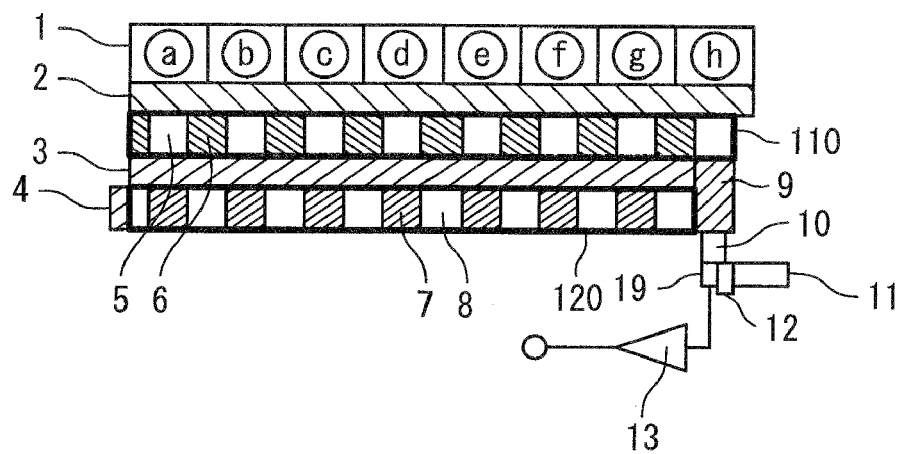
FIGS. 11A to 11E are diagrams illustrating a first electric charge transferring process of the solid imaging device in the first embodiment.
Figure 11B:
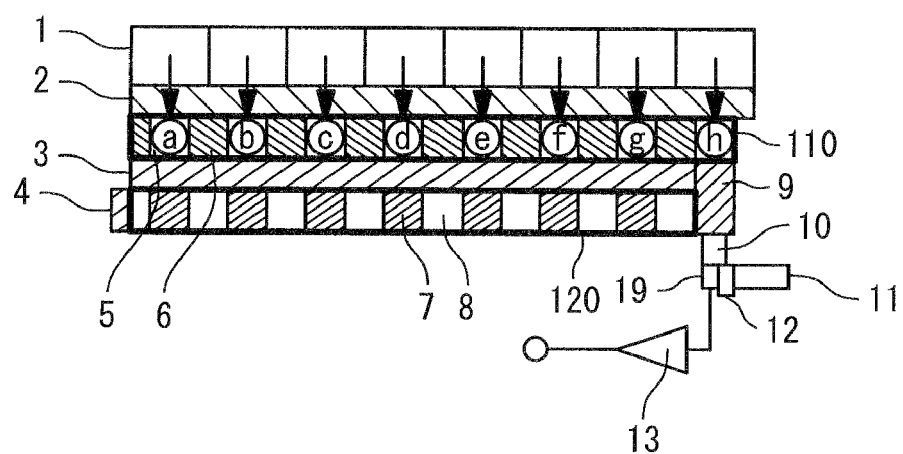
Figure 11C:
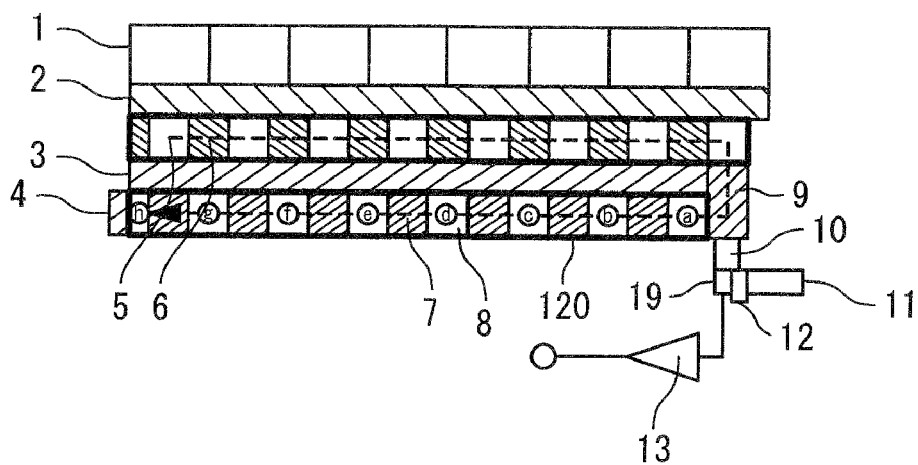
Figure 11D:
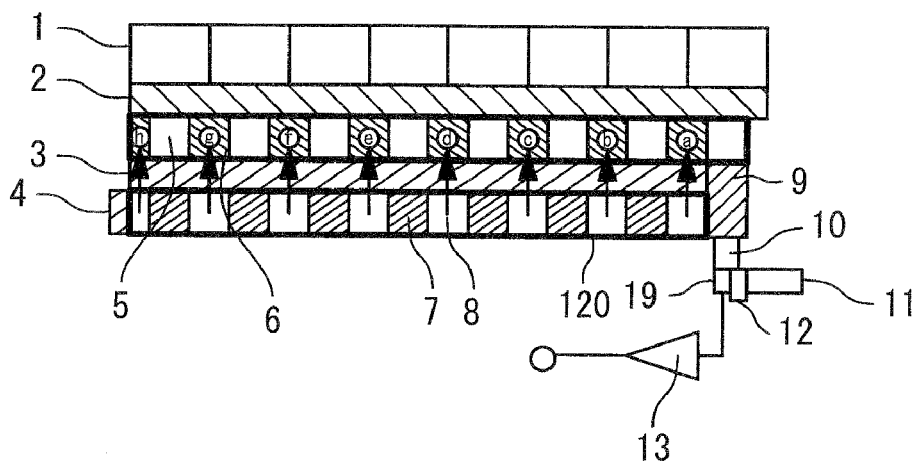
Figure 11E:
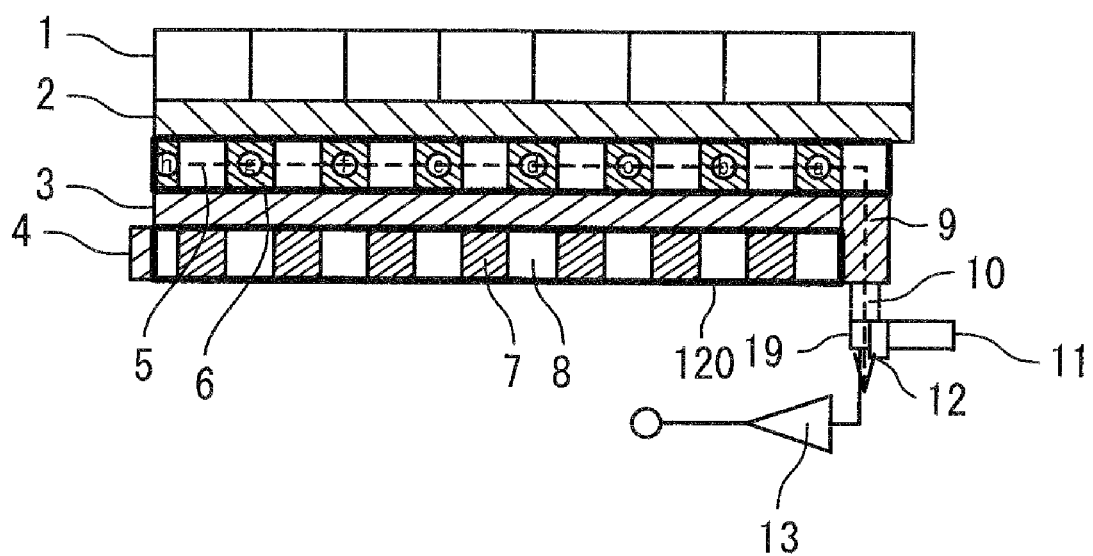

In FIG. 11A, the photodiodes 1 accumulate electric charges a to h through photoelectric conversion. In FIG. 11B, the read gate electrode 2 is turned on (i.e., started) and transfers the electric charges a to h from the photodiodes 1 to the transfer electrodes 5 in the first electric charge transfer section 110. In FIG. 1C, the first electric charge transfer section 110 transfers the electric charges a to h to the second electric charge transfer section 120 in order from the electric charge h to the electric charge a via the electric charge coupling electrode 9 disposed on a side of the electric charge h. In FIG. 11D, the read gate electrode 3 is turned on (i.e., started) and the electric charges a to h accumulated in the transfer electrodes 8 in the second electric charge transfer section 120 are transferred in the current arrangement order to the transfer electrodes 6 in the first electric charge transfer section 110 via the read gate electrode 3. In this manner, the electric charges a to h are arranged in order more approximate to the electric charge coupling electrode 9. In FIG. 11E, the electric charge coupling electrode 9 sends the electric charges a to h to the floating diffusion capacitance section 19 in the order of the electric charges a to h via the last gate electrode 10. The floating diffusion capacitance section 19 converts the electric charges a to h into voltages. The amplifier 13 amplifies the voltage to output it. Thereafter, the reset gate 12 is turned on (i.e., started) and discharges the electric charges a to h accumulated in the floating diffusion capacitance section 19 to the reset drain 11. It should be noted that this operation during transferring the charges in all pixels is adapted to match other resolution with signal output order. When the signal output order may be mismatched with the other resolution, the electric charges a to h may be outputted to the amplifier 13 in order from h to a without using the read gate electrode 3 and the second electric charge transfer section 120.

Here, the transfer gate clock signal $\phi_{TG1}$ is supplied to the read gate electrode 2, and the transfer gate clock signal $\phi_{TG2}$ is supplied to the read gate electrode 3. The reset pulse $\phi_R$ is supplied to the reset gate 12. The drive clock signal $\phi_1$ is supplied to the transfer electrode 5, and the drive clock signal $\phi_2$ is supplied to the transfer electrode 6. The modulation clock signal $\phi_M$ is supplied to the electric charge coupling electrode 9. The clock signal $\phi_L$ is supplied to the last gate electrode 10. The drive clock signal $\phi_3$ is supplied to the transfer electrode 7, and the drive clock signal $\phi_4$ is supplied to the transfer electrode 8. Here, the drive clock signal $\phi_1$ and the drive clock signal $\phi_2$ express a first charge transfer clock signal to be supplied to the first electric charge transfer section 110. In contrast, the drive clock signal $\phi_3$ and the drive clock signal $\phi_4$ express a second charge transfer clock signal to be supplied to the second electric charge transfer section 120. Vout designates an output from the amplifier 13.

Figure 13:
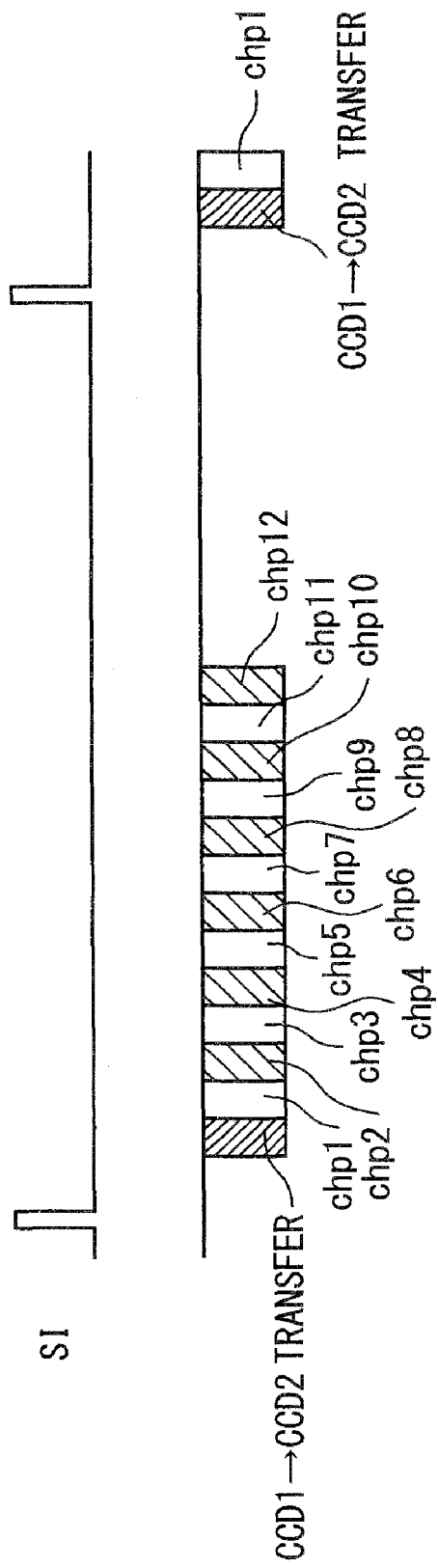
FIG. 13 is a diagram illustrating an output example when a plurality of solid imaging devices are used in the first embodiment.

FIG. 13 illustrates output timings when the above operation is used in a system such as CIS (contact image sensor) to output a plurality of chips in serial. Referring to FIG. 13, first of all, an operation to transfer electric charges from a CCD1 to a CCD2 is carried out in chips 1 to 12 (i.e., chp1 to chp12 in FIG. 13). Here, the chips 1 to 12 are designed to be aligned in one line so as to cover sizes of A4 and A3, for example, in a one-line scanner such as a color scanner. The CCD1 indicates the first electric charge transfer section 110 (i.e., the transfer electrodes 5 and the transfer electrodes 6). The CCD2 indicates the second electric charge transfer section 120 (i.e., the transfer electrodes 7 and the transfer electrodes 8). A signal SI is supplied at every cycle of the system. This example adopts a 12-chip configuration, but the present invention is not limited to this configuration. A period of time during which electric charges are transferred from the first electric charge transfer section 110 to the second electric charge transfer section 120 is added to the head of the chips 1 to 12 before outputting electric charges. However, since the 12 chips are transferred at a same time during a period of time corresponding to one chip, there actually arises no problem in many cases.

Figure 14A:
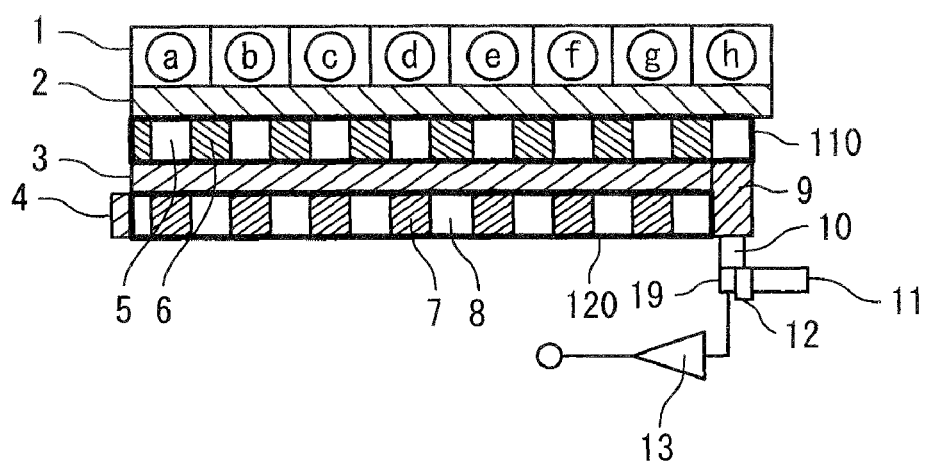
FIGS. 14A to 14E are diagrams illustrating a second electric charge transferring process of the solid imaging device in the first embodiment.
Figure 14B:
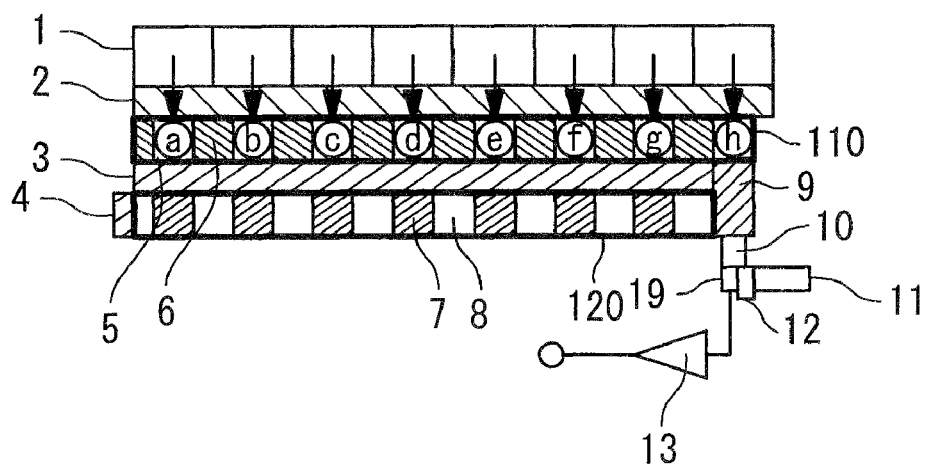
Figure 14C:
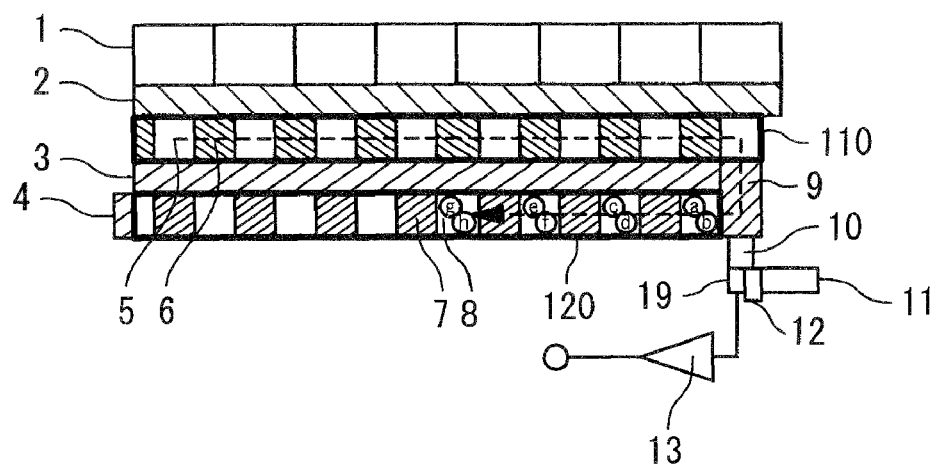
Figure 14D:
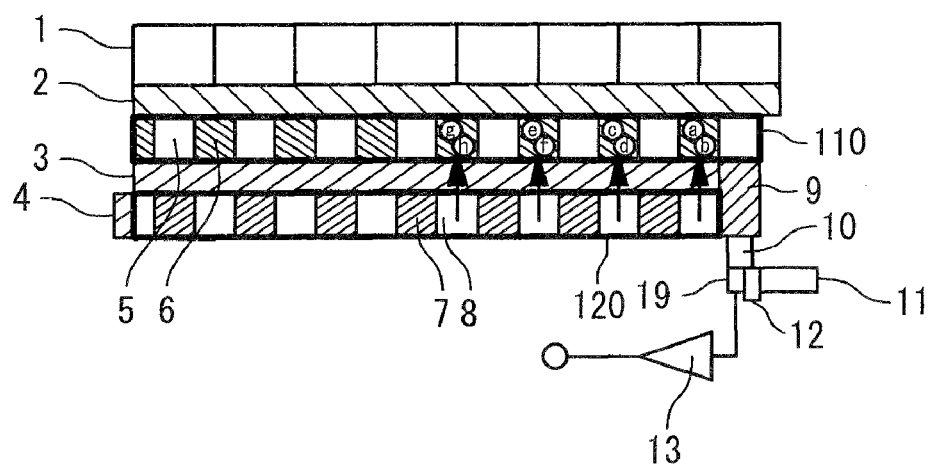
Figure 14E:
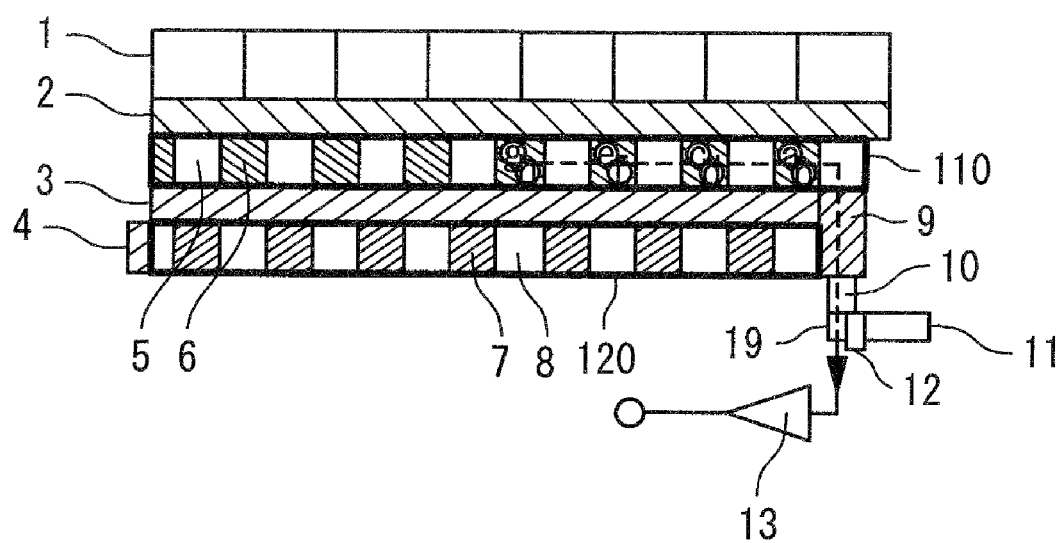
Figure 15:
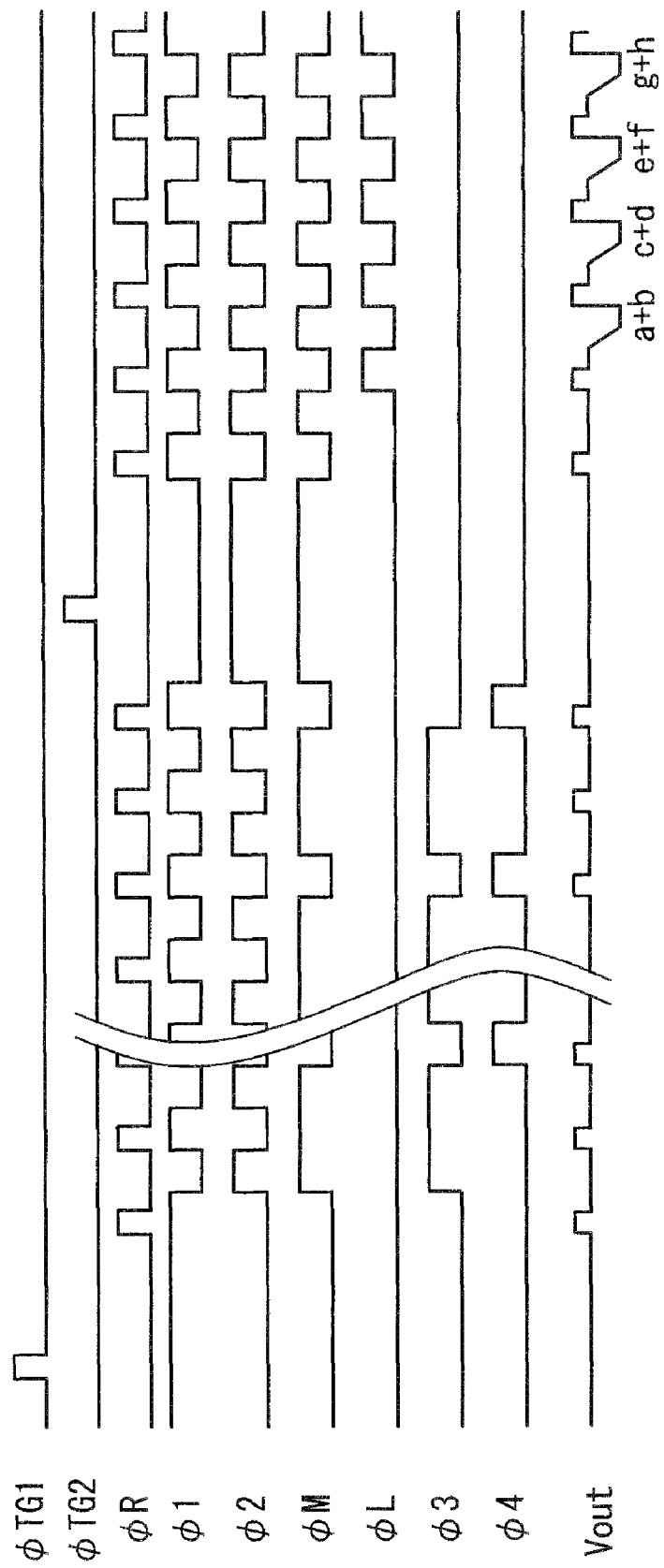
FIG. 15 shows timing charts in a 2-pixel coupling operation of the solid imaging device in the first embodiment.

FIGS. 14A to 14E illustrate a transfer process during 2-pixel coupling, and FIG. 15 illustrates its timing.

In FIG. 14A, each of the photodiodes 1 in the photoelectric converting section accumulates an electric charge obtained through photoelectric conversion. In FIG. 14B, the read gate electrode 2 is turned on and transfers the electric charges a to h to the transfer electric electrodes 5 in the first electric charge transfer section 110. At this time, timing is identical to the standard timing. In FIG. 14C, the electric charge coupling electrode 9 transfers the electric charges a to h to the second electric charge transfer section 120. At this time, 2-pixel coupling is carried out by making frequencies of the second electric charge transfer section 120 and the electric charge coupling electrode 9 to be a half of that of the first electric charge transfer section 110. That is, the second electric charge transfer section 120 accumulates the transferred charges every two of the electric charges a to h in one transfer electrode 8. Here, the transfer electrodes 8 in the second electric charge transfer section 120 accumulate a pair of the electric charges a and b, a pair of the electric charges c and d, a pair of the electric charges e and f and a pair of the electric charges q and h in order from the side more approximate to the electric charge coupling electrode 9. In FIG. 14D, the read gate electrode 3 is turned on such that pairs of the electric charges a to h accumulated in the transfer electric electrodes 8 of the second electric charge transfer section 120 are transferred to the transfer electric electrodes 6 of the first electric charge transfer section 110. In FIG. 14E, the electric charge coupling electrode 9 sends the pairs of the electric charges a to h to the floating diffusion capacitance section 19 via the last gate electrode 10. The floating diffusion capacitance section 19 converts the pairs of the electric charges a to h to voltages. The amplifier 13 amplifies the voltages to output it. Thereafter, the reset gate 12 is turned on and discharges the electric charges a to h accumulated in the floating diffusion capacitance section 19 to the reset drain 11.

Referring to FIGS. 14A to 14E and 15, the transfer gate clock signal $\phi_{TG1}$ is supplied to the read gate electrode 2, and the transfer gate pulse $\phi_{TG2}$ is supplied to the read gate electrode 3. The reset pulse $\phi_R$ is supplied to the reset gate 12. The drive clock signal $\phi_1$ is supplied to the transfer electrode 5, and the drive clock signal $\phi_2$ is supplied to the transfer electrode 6. The modulation clock signal $\phi_M$ is supplied to the electric charge coupling electrode 9, and the clock signal $\phi_L$ is supplied to the last gate electrode 10. The drive clock signal $\phi_3$ is supplied to the transfer electrode 7, and the drive clock signal $\phi_4$ is supplied to the transfer electrode 8. Here, the drive clock signal $\phi_1$ and the drive clock signal $\phi_2$ express a first charge transfer clock signal to be supplied to the first electric charge transfer section 110. The drive clock signal $\phi_3$ and the drive clock signal $\phi_4$ express a second charge transfer clock signal to be supplied to the second electric charge transfer section 120. Vout denotes an output from the amplifier 13. Frequencies of the modulation clock signal $\phi_M$ and the drive clock signals $\phi_3$ and $\phi_4$ (the second charge transfer clock signal) are a half of that of the drive clock signal $\phi_1$ and $\phi_2$ (the first charge transfer clock signal).

Figure 16:
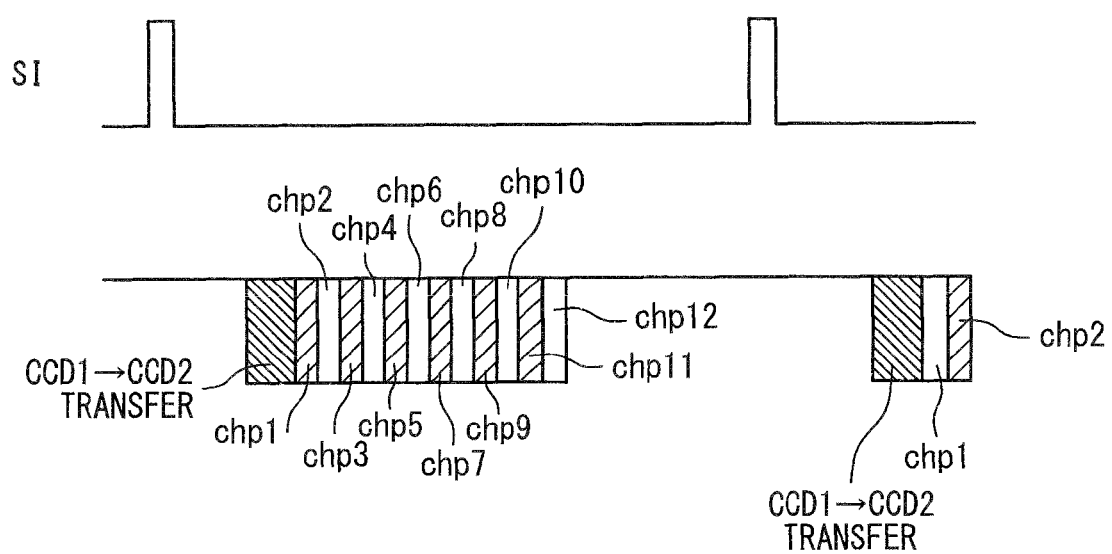
FIG. 16 is a diagram illustrating an output example in the 2-pixel coupling operation when a plurality of solid imaging devices are used in the first embodiment.

FIG. 16 illustrates output timing when the above operation is used in a system for output 12 chips in serial. FIG. 16 is a diagram illustrating 2-pixel coupling. The chips 1 to 12, the CCD1 and the CCD2 are similar to those of FIG. 13. An output period of time of the 12 chips in 2-pixel coupling is reduced to a half of that in the standard timing while the transfer time from the first electric charge transfer section 110 to the second electric charge transfer section 120 is equal to that of the standard timing. Therefore, a period of time for two chips (one chip in the conversion of the standard timing) spends in 2-pixel coupling as the transfer time.

Figure 12:
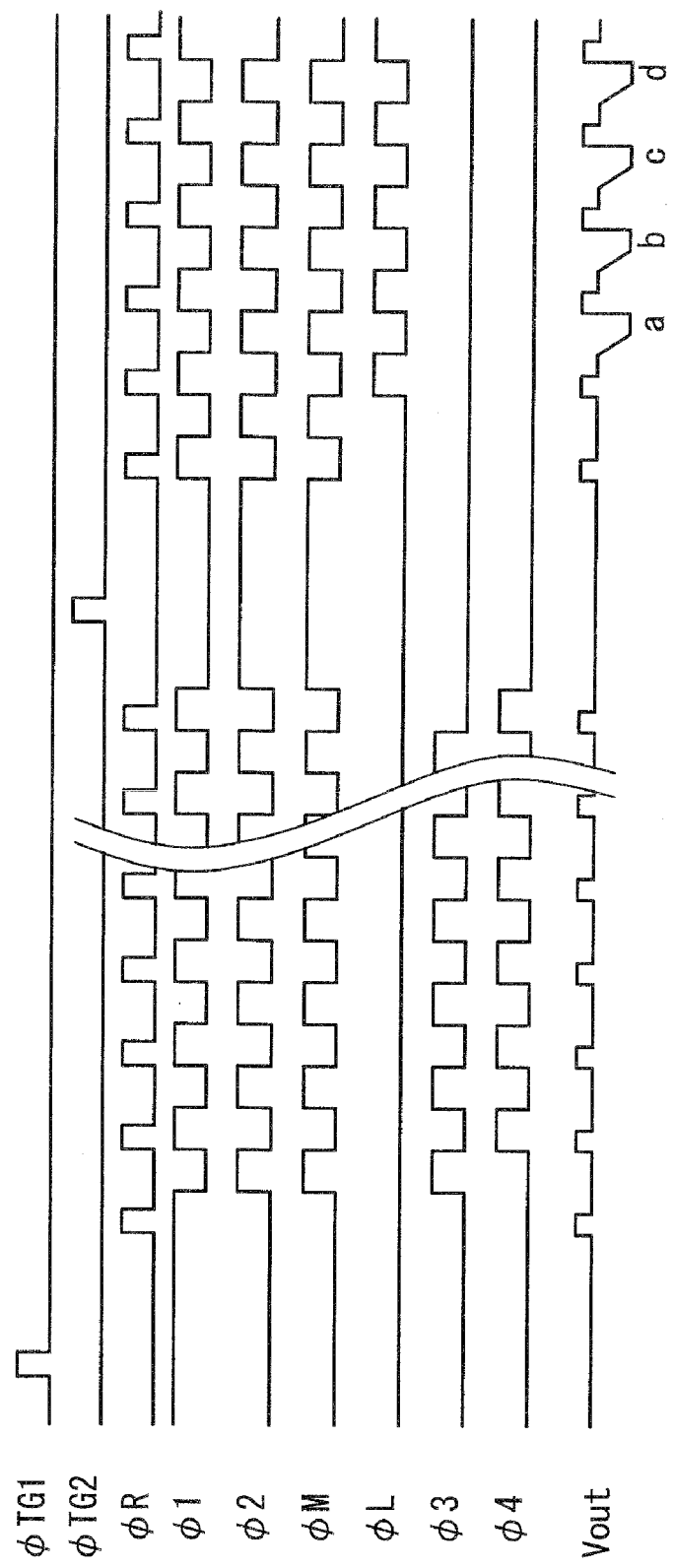
FIG. 12 shows timing charts in a standard operation of the solid imaging device in the first embodiment.

It should be noted that the solid imaging device 100 according to the first embodiment of the present invention may be driven even by replacing the electric charge coupling electrode 9 with the transfer electrode 6 shown in FIG. 10. That is to say, the solid imaging device 100 may be driven by supplying the drive clock signal $\phi_2$ to the electric charge coupling electrode 9 as illustrated in FIG. 32 and supplying the drive clock signal $\phi_3$ and the drive clock signal $\phi_4$ in such a manner as opposed to those of FIG. 15. This is certified by the fact that the modulation clock signal $\phi_M$ and the drive clock signal $\phi_2$ illustrated in FIGS. 12 and 32 are equal to each other. In this case, the transfer electrode 8 in the initial stage couples electric charges in place of the electric charge coupling electrode 9.

Second Embodiment

The solid imaging device according to a second embodiment of the present invention will be described in detail with reference to the attached drawings. The transfer time from the first electric charge transfer section 110 to the second electric charge transfer section 120 in the first embodiment has larger effects on an output time as the resolution becomes lower. If the effects are unallowable, it is construed to increase the number of chips or increase the frequency only when electric charges are transferred from the first electric charge transfer section 110 to the second electric charge transfer section 120. A structural improvement in the second embodiment is illustrated in FIG. 17.

Figure 17:
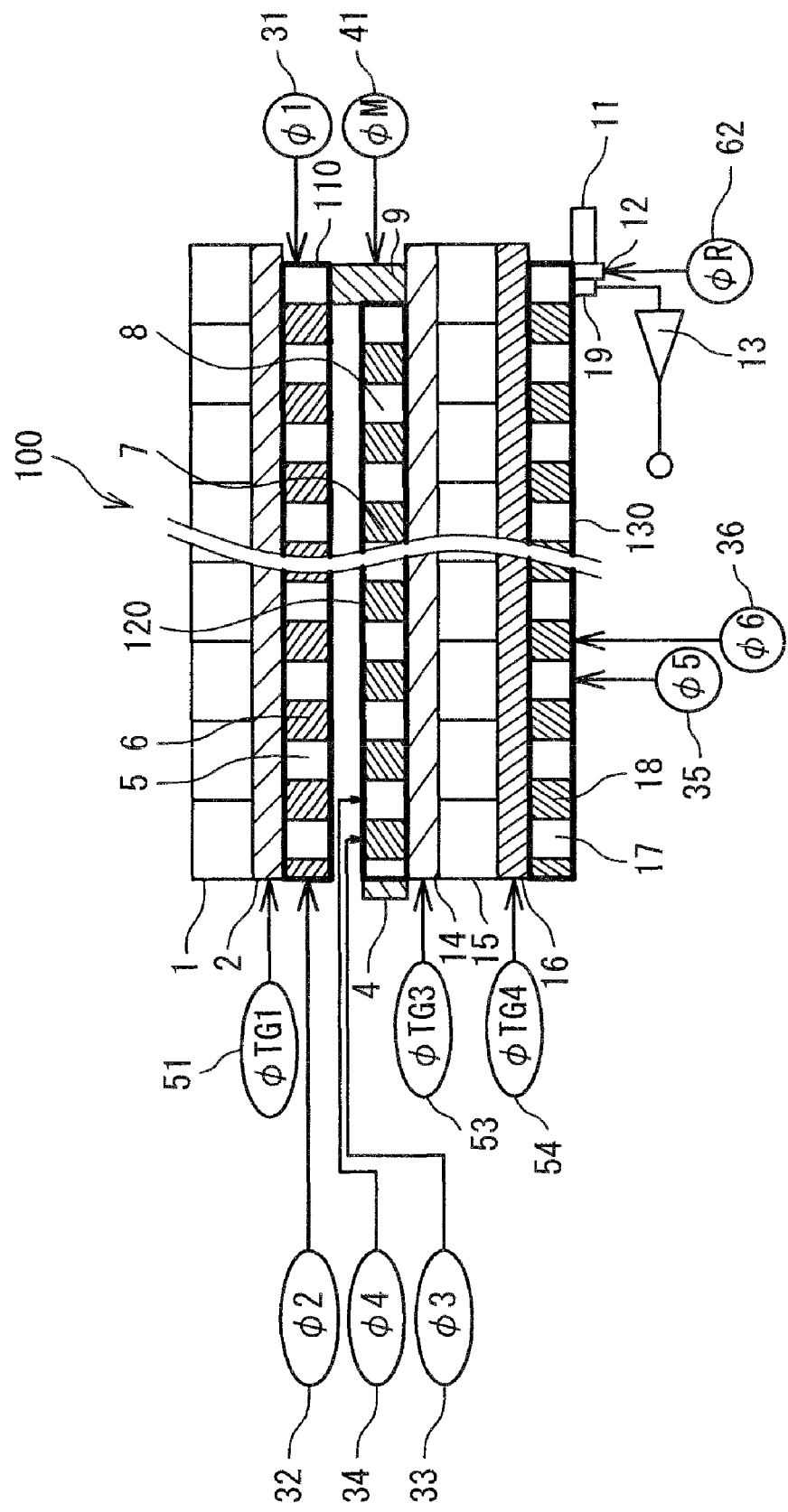
FIG. 17 is a diagram showing a configuration of the solid imaging device according to a second embodiment of the present invention.

As illustrated in FIG. 17, the solid imaging device 100 according to the present invention includes the photodiodes 1 in the photoelectric converting section, the read gate electrode 2, the overflow drain section 4, the transfer electrodes 5, the transfer electrodes 6, the transfer electrodes 7, the transfer electrodes 8, the electric charge coupling electrode 9, the reset drain 11, the reset gate 12, the amplifier 13, the read gate electrode 14, memory regions 15, a read gate electrode 16, transfer electrodes 17, transfer electrodes 18 and the floating diffusion capacitance section 19.

Here, the transfer electrodes 5 and the transfer electrodes 6 constitute a first electric charge transfer section 110. The transfer electrodes 7 and the transfer electrodes 8 constitute the second electric charge transfer section 120. Moreover, the transfer electrodes 17 and the transfer electrodes 18 constitute a third electric charge transfer section 130.

The read gate electrode 2 is interposed between the photodiodes 1 in the photoelectric converting section and the first electric charge transfer section 110. The read gate electrode 3 interposed between the first electric charge transfer section 110 and the second electric charge transfer section 120 shown in FIG. 10 may be omitted. Although in the first embodiment, the electric charges are sent from the second electric charge transfer section 120 to the first electric charge transfer section 110 via the read gate electrode 3 and then transferred to the floating diffusion capacitance section 19 via the electric charge coupling electrode 9 and the last gate electrode 10, the read gate 3 is not required in the second embodiment because the electric charges are sent from the second electric charge transfer section 120 to the memory regions 15 via the read gate electrode 14 as will be described later. The second electric charge transfer section 120 and the memory regions 15 are connected via the read gate electrode 14. The memory regions 15 are connected to the third electric charge transfer section 130 via the read gate electrode 16. Additionally, the final transfer electrode 17 on the output side of the third transfer electrode is connected to the floating diffusion capacitance section 19 via an output gate electrode (output electrode: not illustrated). The floating diffusion capacitance section 19 is connected to the amplifier 13, and the reset drain 11 via the reset gate 12. In the second embodiment, the floating diffusion capacitance section 19 is a floating diffusion capacitance. The amplifier 13 is an electric charge detecting unit.

Here, a clock generating circuit (not shown) supplies a drive clock signal $\phi_1$ 31 to the transfer electrodes 5 in the first electric charge transfer section 110, as illustrated in FIG. 17. Also, the clock generating circuit supplies the drive clock signal $\phi_2$ 32 to the transfer electrodes 6 in the first electrode transfer section 110. The clock generating circuit supplies a drive clock signal $\phi_3$ 33 to the transfer electrodes 7 in the second electric charge transfer section 120. The clock generating circuit supplies a drive clock signal $\phi_4$ 34 to the transfer electrodes 8 in the second electrode transfer section 120. Moreover, the clock generating circuit supplies a drive clock signal $\phi_5$ 35 to the transfer electrodes 17 in the third electric charge transfer section 130. The clock generating circuit supplies a drive clock signal $\phi_6$ 36 to the transfer electrodes 18 in the third electric charge transfer section 130. The clock generating circuit supplies a modulation clock signal $\phi_M$ 41 to the electric charge coupling electrode 9. The clock generating circuit supplies a selection signal to switch between standard transfer and 2-pixel coupling transfer. The clock generating circuit supplies a transfer gate clock signal $\phi_{TG1}$ 51 to the read gate electrode 2, and supplies a transfer gate clock signal $\phi_{TG3}$ 53 to the read gate electrode 14. The clock generating circuit supplies a transfer gate clock signal $\phi_{TG4}$ 54 to the read gate electrode 16. The clock generating circuit supplies a reset pulse $\phi_R$ 62 to the reset gate 12.

Figure 18A:
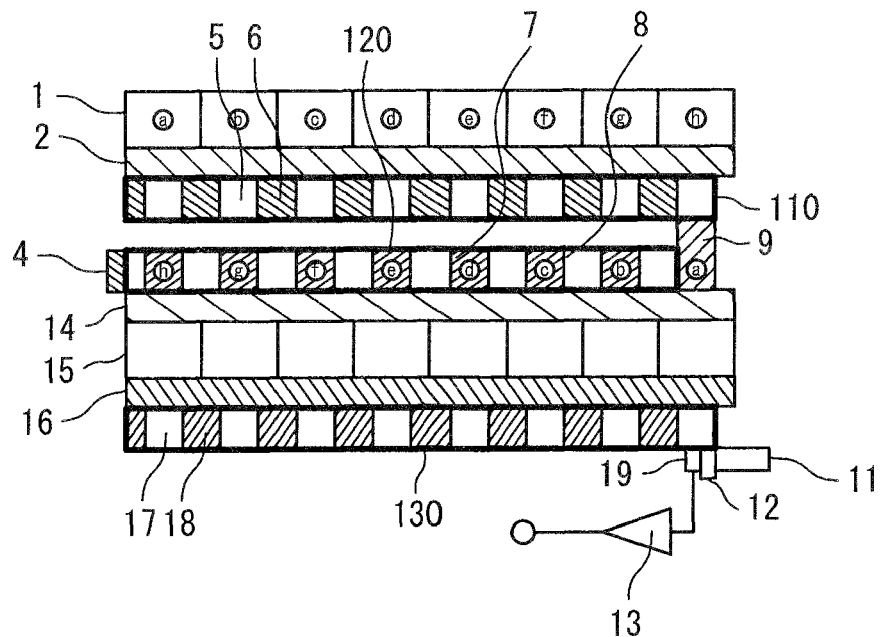
FIGS. 18A to 18D are diagrams illustrating a first electric charge transferring process of the solid imaging device in the second embodiment.
Figure 18B:
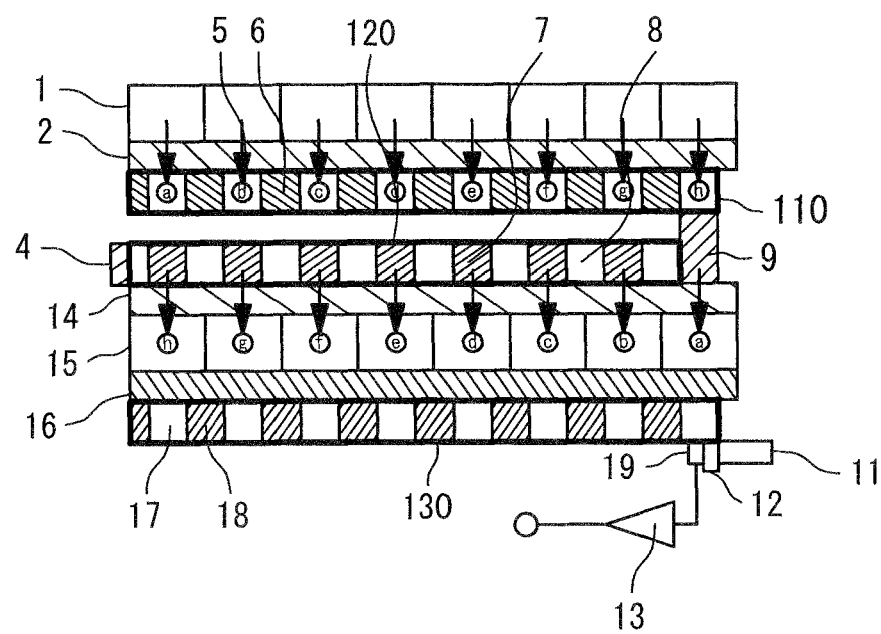
Figure 18C:
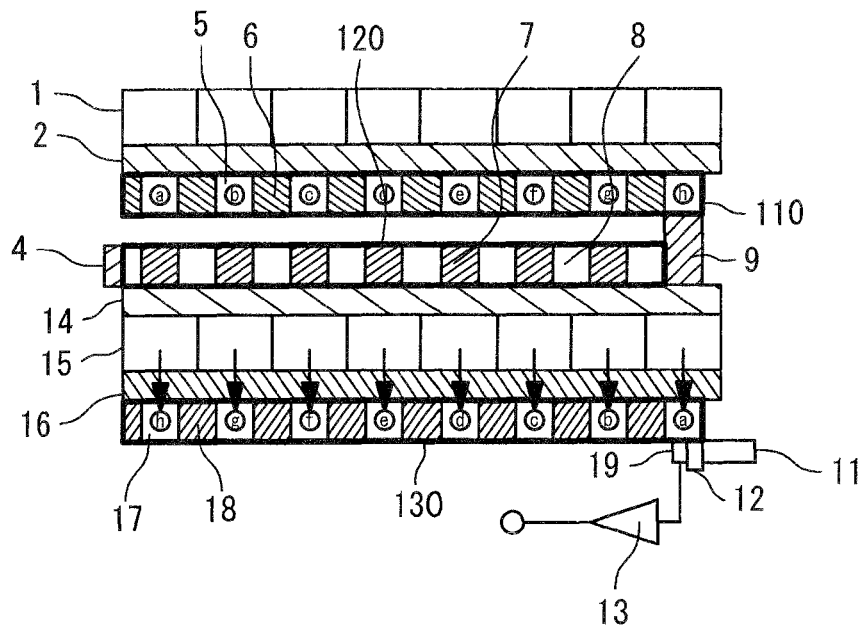
Figure 18D:
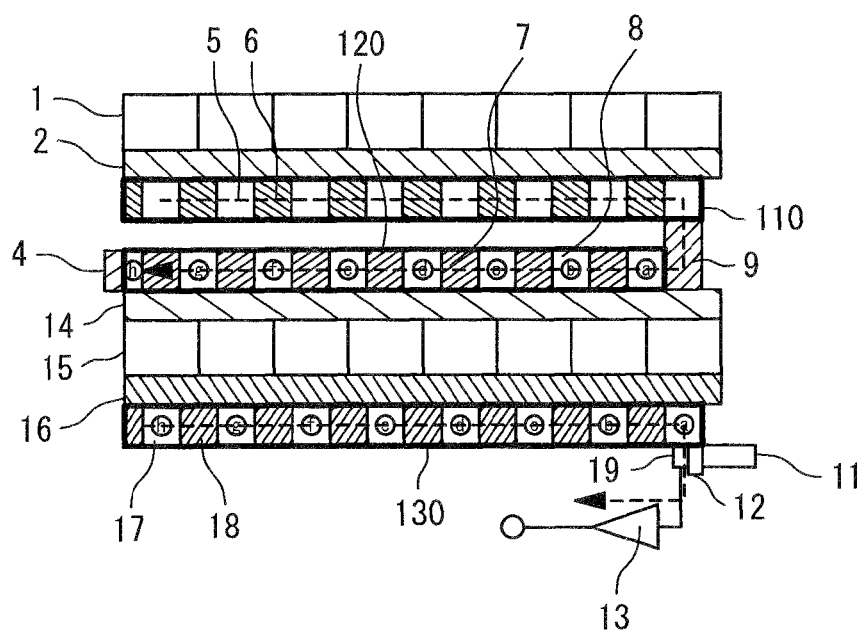
Figure 19:
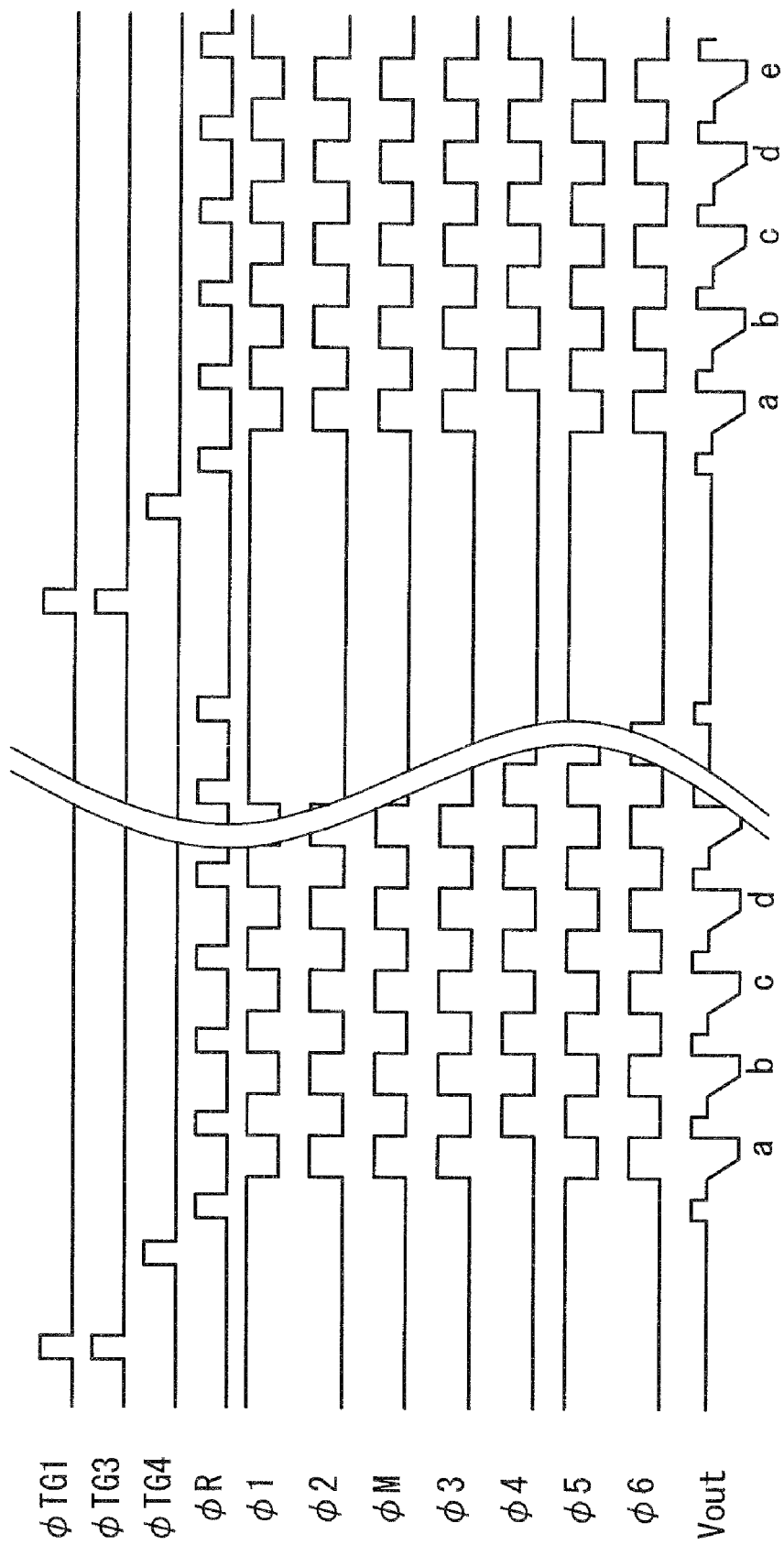
FIG. 19 shows timing charts in a standard operation of the solid imaging device in the second embodiment.

FIGS. 18A to 18D illustrate an example of standard process to transfer electric charges, and FIG. 19 illustrates its timings.

In FIG. 18A, electric charges a to h generated at this time are accumulated in the photodiodes 1 in the photoelectric converting section. At this time, the electric charges a to h accumulated at previous time have been accumulated in the second electric charge transfer section 120. In FIG. 18B, the read gate electrode 2 and the read gate electrode 14 are turned on and transfer the electric charges a to h generated at this time to the first electric charge transfer section 110 and transfer the electric charges a to h accumulated at the previous time to the memory regions 15. In FIG. 18C, the read gate electrode 16 is turned on and transfers the electric charges a to h accumulated at previous time from the memory regions 15 to the third electric charge transfer section 130. In FIG. 18D, the first electric charge transfer section 110 transfers the electric charges a to h generated at this time to the second electric charge transfer section 120. The third electric charge transfer section 130 transfers the electric charges a to h accumulated at previous time to the floating diffusion capacitance section 19. The floating diffusion capacitance section 19 converts the electric charges a to h accumulated at previous time into voltages. The amplifier 13 amplifies the voltage to output it. After the outputs, the reset gate 12 is turned on and discharges the electric charges a to h accumulated in the floating diffusion capacitance section 19 to the reset drain 11.

Referring to FIGS. 18A to 18D, and 19, the transfer gate clock signal $\phi_{TG1}$ is supplied to the read gate electrode 2, and the transfer gate clock signal $\phi_{TG3}$ is supplied to the read gate electrode 14. The transfer gate clock signal $\phi_{TG4}$ is supplied to the read gate electrode 16. The reset pulse $\phi_R$ is supplied to the reset gate 12. The drive clock signal $\phi_1$ is supplied to the transfer electrodes 5, and the drive clock signal $\phi_2$ is supplied to the transfer electrodes 6. The modulation clock signal $\phi_M$ is supplied to the electric charge coupling electrode 9. The drive clock signal $\phi_3$ is supplied to the transfer electrodes 7, and the drive clock signal $\phi_4$ is supplied to the transfer electrodes 8. The drive clock signal $\phi_5$ is supplied to the transfer electrodes 17, and the drive clock signal $\phi_6$ is supplied to the transfer electrodes 18. Here, the drive clock signal $\phi_1$ and the drive clock signal $\phi_2$ express a first charge transfer clock signal to be supplied to the first electric charge transfer section 110; the drive clock signal $\phi_3$ and the drive clock signal $\phi_4$ express a second charge transfer clock signal to be supplied to the second electric charge transfer section 120; and the drive clock signal $\phi_5$ and the drive clock signal $\phi_6$ express a third charge transfer clock signal to be supplied to the third electric charge transfer section 130. Vout denotes an output from the amplifier 13.

Figure 20A:
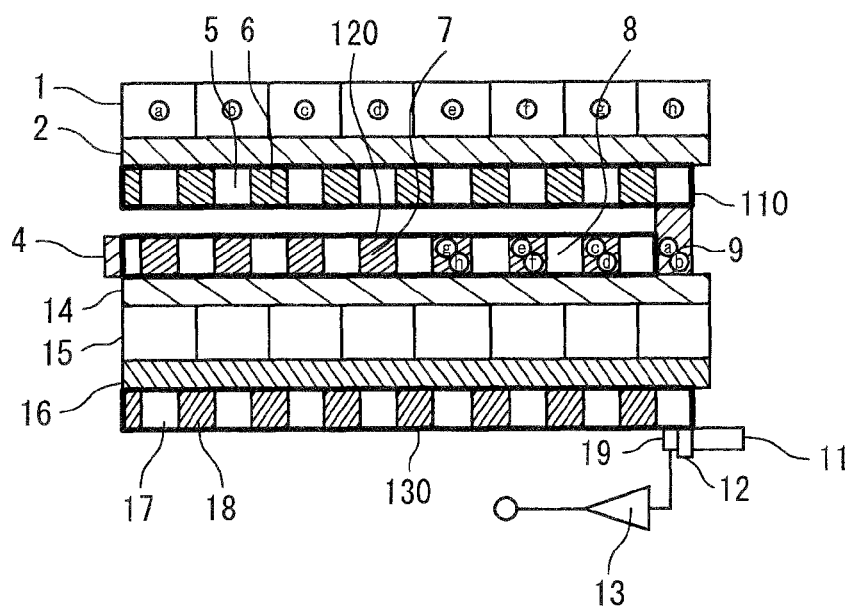
FIGS. 20A to 20D are diagrams illustrating a second electric charge transferring process of the solid imaging device in the second embodiment.
Figure 20B:
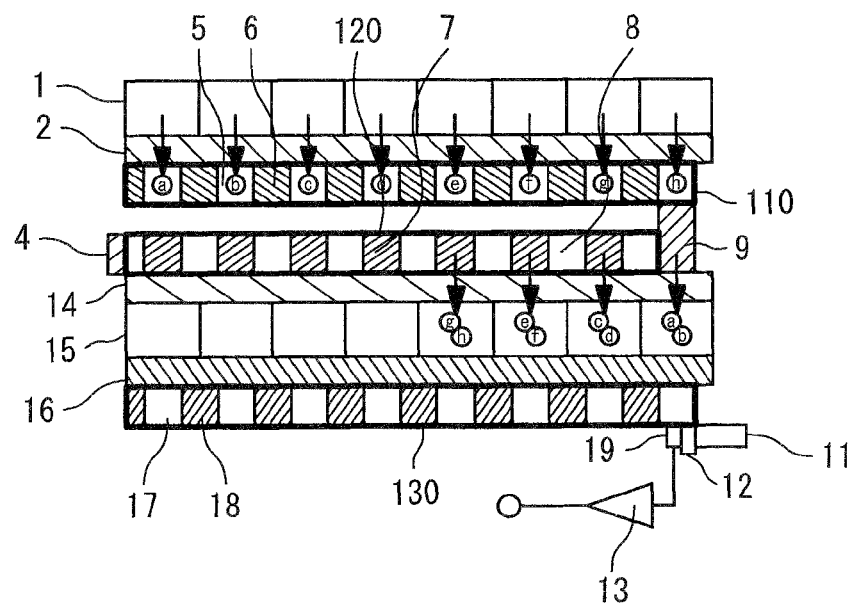
Figure 20C:
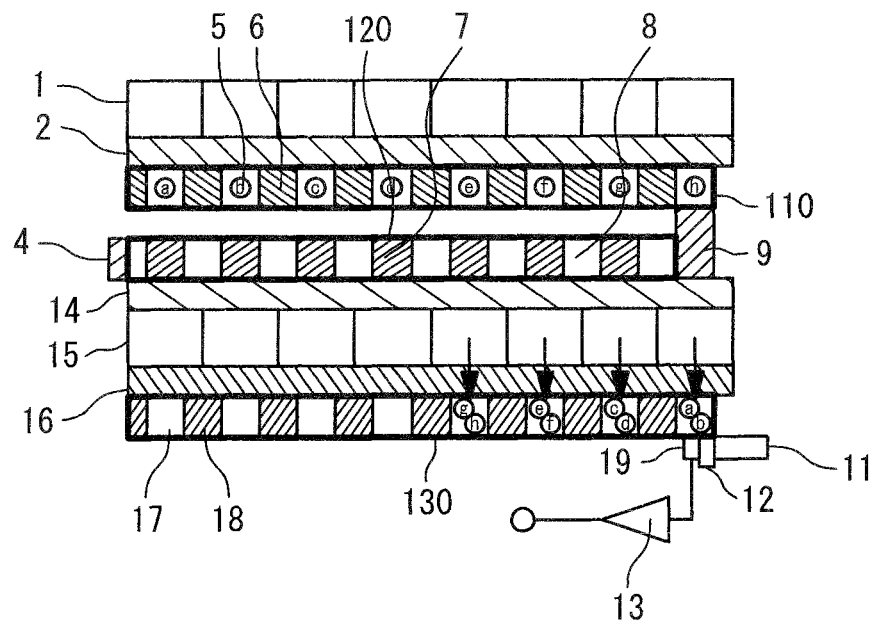
Figure 20D:
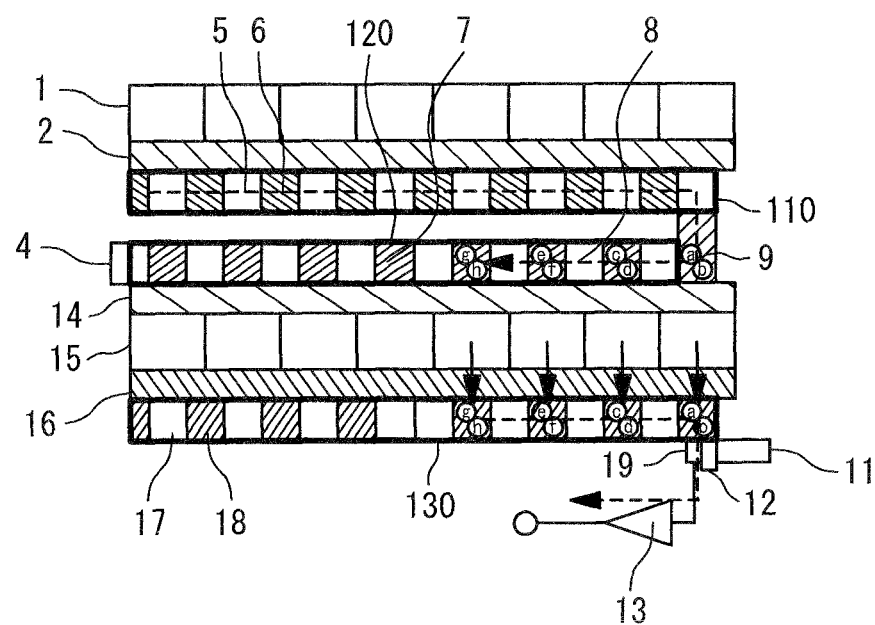
Figure 21:
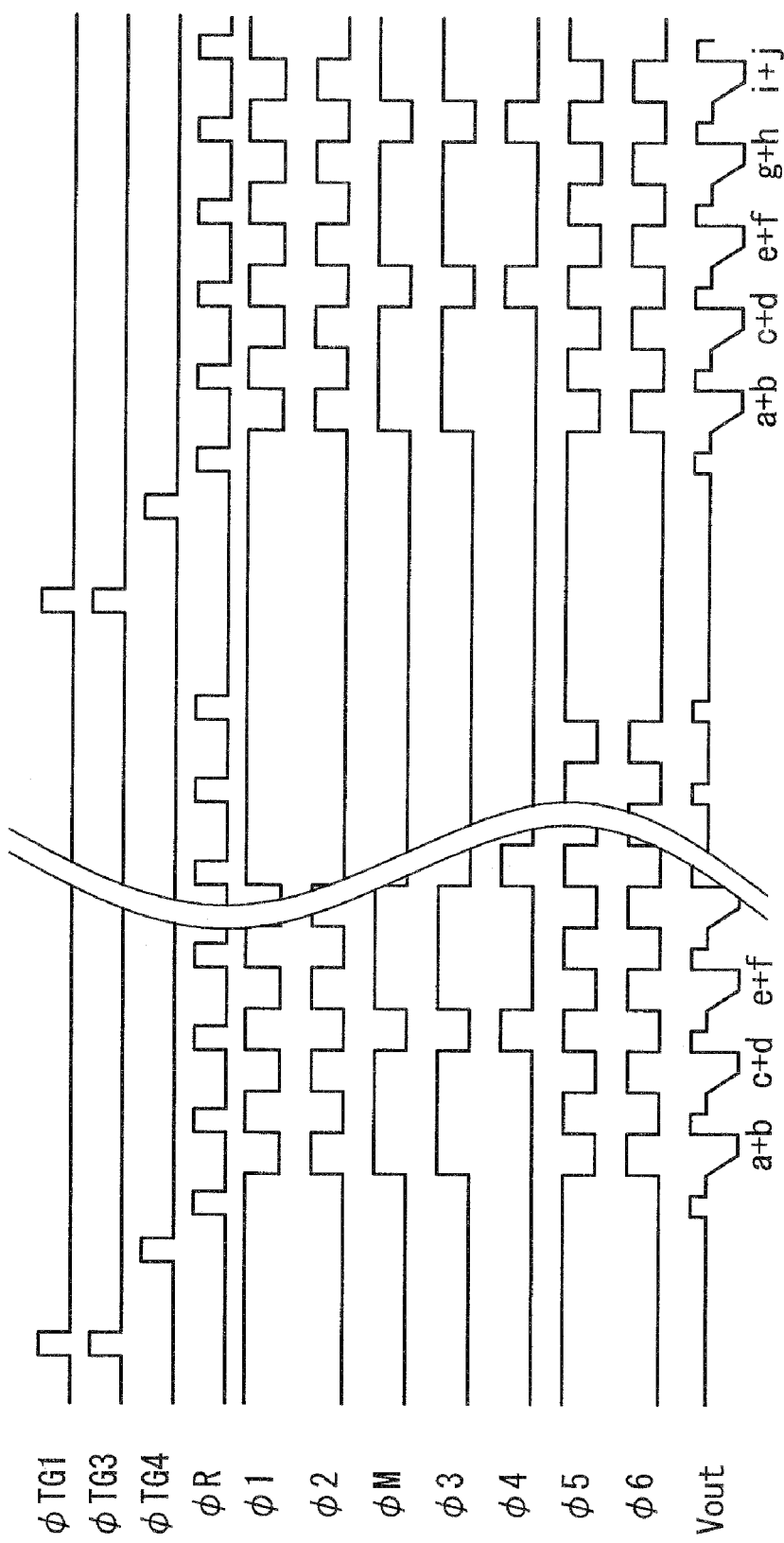
FIG. 21 shows timing charts in a 2-pixel coupling operation of the solid imaging device in the second embodiment.

FIGS. 20A to 20D illustrate a transferring process during 2-pixel coupling, and FIG. 21 illustrates the timings.

In FIG. 20A, electric charges a to h generated at this time are accumulated in the photodiodes 1 in the photoelectric converting section. At this time, the electric charges a to h accumulated at previous time have been accumulated in the second electric charge transfer section 120 in a state in which 2-pixel coupling is carried out at a half of the frequency of the clock signal applied to the first electric charge transfer section 110. In FIG. 20B, the read gate electrode 2 and the read gate electrode 14 are turned on and transfer the electric charges a to h generated at this time to the first electric charge transfer section 110 and transfer the electric charges a to h accumulated at previous time to the memory regions 15. In FIG. 20C, the read gate electrode 16 is turned on and transfers the electric charges a to h accumulated at previous time from the memory regions 15 to the third electric charge transfer section 130. In FIG. 20D, the first electric charge transfer section 110 transfers the electric charges a to h generated at this time to the second electric charge transfer section 120. At this time, the second electric charge transfer section 120 transfers the electric charges at a half of the frequency of the clock signal applied to the first electric charge transfer section 110 in order to add the electric charges. The third electric charge transfer section 130 sends the electric charges a to h to the floating diffusion capacitance section 19. The floating diffusion capacitance section 19 converts the electric charges a to h accumulated at previous time into voltages. The amplifier 13 amplifies the voltage to output it. After the outputs, the reset gate 12 is turned on and discharges the electric charges a to h accumulated in the floating diffusion capacitance section 19 to the reset drain 11.

Referring to FIGS. 20A to 20D and 21, the transfer gate clock signal $\phi_{TG1}$ is supplied to the read gate electrode 2, and the transfer gate clock signal $\phi_{TG3}$ is supplied to the read gate electrode 14. The transfer gate clock signal $\phi_{TG4}$ is supplied to the read gate electrode 16. The reset pulse $\phi_R$ is supplied to the reset gate 12. The drive clock signal $\phi_1$ is supplied to the transfer electrodes 5, and the drive clock signal $\phi_2$ is supplied to the transfer electrodes 6. The modulation clock signal $\phi_M$ is supplied to the electric charge coupling electrode 9. The drive clock signal $\phi_3$ is supplied to the transfer electrodes 7, and the drive clock signal $\phi_4$ is supplied to the transfer electrodes 8. The drive clock signal $\phi_5$ is supplied to the transfer electrodes 17, and the drive clock signal $\phi_6$ is supplied to the transfer electrodes 18. Here, the drive clock signal $\phi_1$ and the drive clock signal $\phi_2$ express a first charge transfer clock signal to be supplied to the first electric charge transfer section 110; the drive clock signal $\phi_3$ and the drive clock signal $\phi_4$ express a second charge transfer clock signal to be supplied to the second electric charge transfer section 120; and the drive clock signal $\phi_5$ and the drive clock signal $\phi_6$ express a third charge transfer clock signal to be supplied to the third electric charge transfer section 130. Vout designates an output from the amplifier 13. Frequencies of the modulation clock signal $\phi_M$ and the drive clock signals $\phi_3$ and $\phi_4$ (the second charge transfer clock signal) are a half of that of the drive clock signals $\phi_1$ and $\phi_2$ (the first charge transfer clock signal). Frequencies of the drive clock signals $\phi_5$ and $\phi_6$ (the third charge transfer clock signal) are the same as that of the drive clock signals $\phi_1$ and $\phi_2$ (the first charge transfer clock signal).

Figure 22:
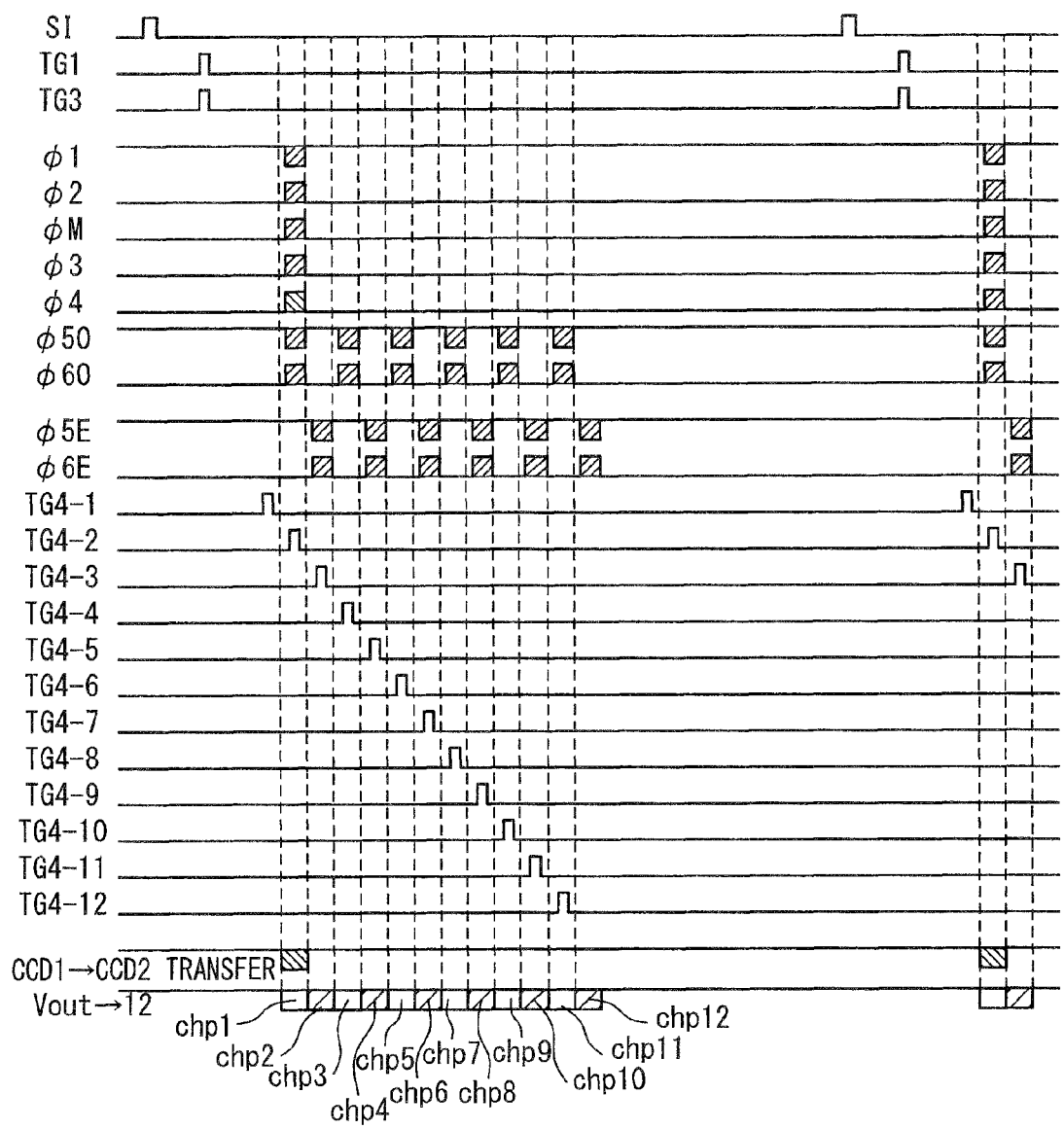
FIG. 22 shows timing charts in an output example when a plurality of solid imaging devices are used in the second embodiment.

FIG. 22 illustrates timings for the standard output in a system to output in serial in a 12-chip configuration. The gate electrode 16 connected between the memory regions 15 and the third electric charge transfer section 130 is supplied with electric power (the transfer gate clock signal $\phi_{TG4}$) to each of the chips independently. Here, the clock generating circuit (not shown) supplies the transfer gate clock signals $\phi_{TG4-1}$ to $\phi_{TG4-12}$ to the read gate electrodes 16 of the chips 1 to 12 (i.e., chp1 to chp12), respectively. In the third electric charge transfer section 130, the drive clock signal $\phi_5$ and the drive clock signal $\phi_6$ respectively supplied to the transfer electrodes 17 and the transfer electrodes 18 are provided at different timings set for the respective chips. A drive clock signal $\phi_{5O}$ and a drive clock signal $\phi_{6O}$ are respectively supplied to the transfer electrodes 17 and the transfer electrodes 18 of the chips on an odd side, whereas a drive clock signal $\phi_{5E}$ and a drive clock signal $\phi_{6E}$ are respectively supplied to the transfer electrodes 17 and the transfer electrodes 18 of the chips on an even side. The drive clock signal $\phi_{5O}$ and the drive clock signal $\phi_{5E}$ are provided to the chips at different timings to each other. The drive clock signal $\phi_{6O}$ and the drive clock signal $\phi_{6E}$ are provided to the chips at different timings to each other. The chips on the odd side and the chips on the even side are driven by using different clock signals in the third electric charge transfer section 130 in order to prevent an output interval from becoming long by performing output from the chips on the even side (or the chips on the odd side) in a period during which the third electric charge transfer section 130 is stopped for the chips on the odd side (or the chips on the even side) to read the electric charges from the read gate electrode 16. If it is possible to make the transfer time from the memory region (charge accumulation section) 15 to the third charge transfer section equal to the ON time of one clock in the third charge transfer section 130, it is not necessary to group the drive of the third charge transfer section 130 into an odd drive and an even drive.

The generated electric charges are subjected to a low-resolution process without making any change and outputted in the first embodiment, whereas the electric charges to be outputted have been accumulated at previous time and already subjected to the low-resolution process in the second embodiment. Therefore, the transfer time from the first electric charge transfer section 110 to the second electric charge transfer section 120 does not influence the output time.

Figure 23:
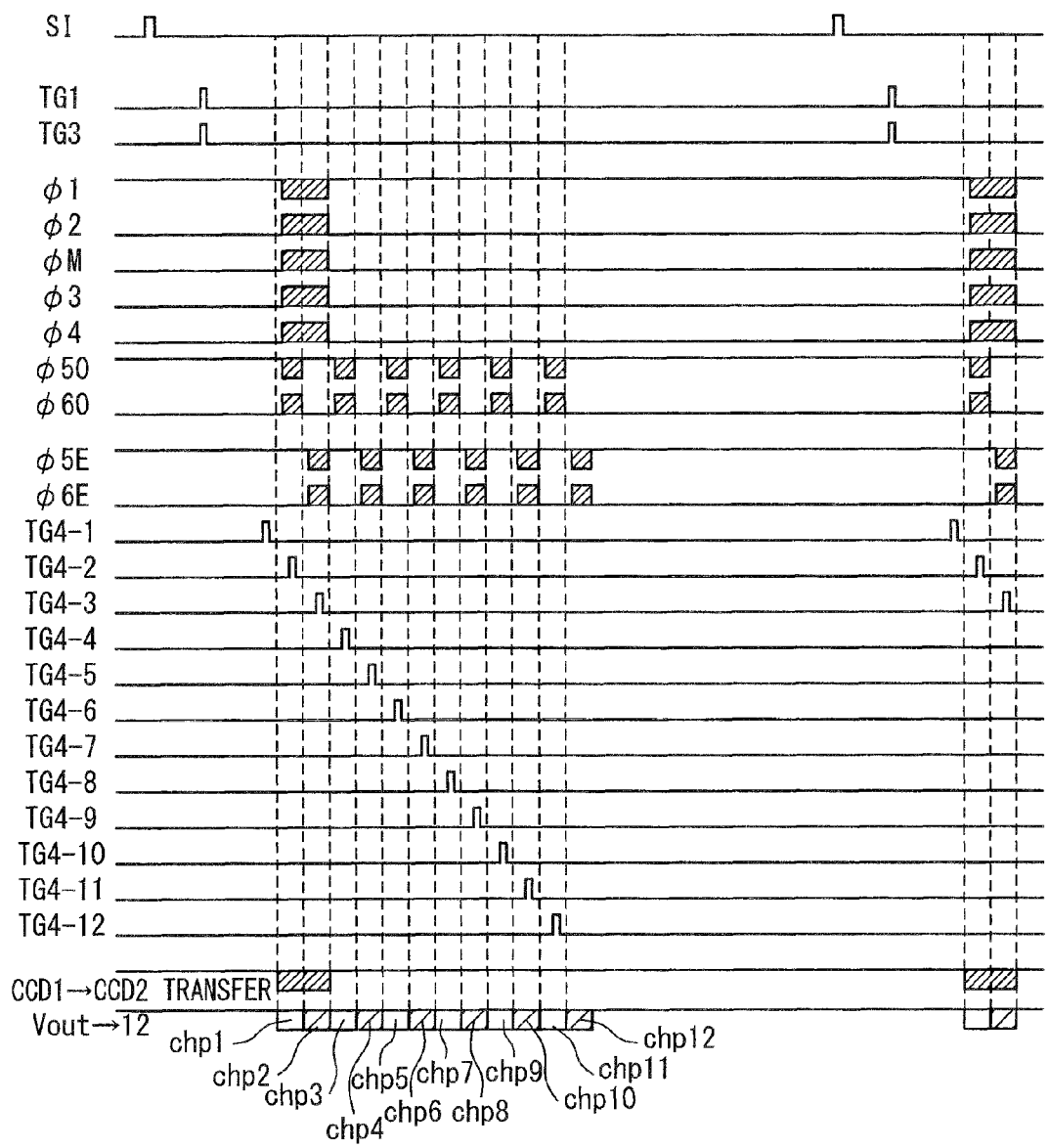
FIG. 23 shows timing charts in another output example in the 2-pixel coupling operation when a plurality of solid imaging devices are used in the second embodiment.

FIG. 23 illustrates timing when 2-pixel coupling is carried out in a system for serial output of 12 chips. The transfer from the first electric charge transfer section 110 to the second electric charge transfer section 120 is carried out within an output period of time, like in FIG. 22, thereby never influencing the output time.

In case of the 12-chip configuration, a signal (output voltages Vout) can be outputted without changing a data rate and a frequency of the clock signals since the output period of time is not influenced up to 8-pixel coupling. Moreover, the number of pixels in coupling can be further increased by increasing the number of chips.

In this manner, signals can be outputted at any resolutions without varying the frequency or data rate according to the present embodiment.

Figure 24:
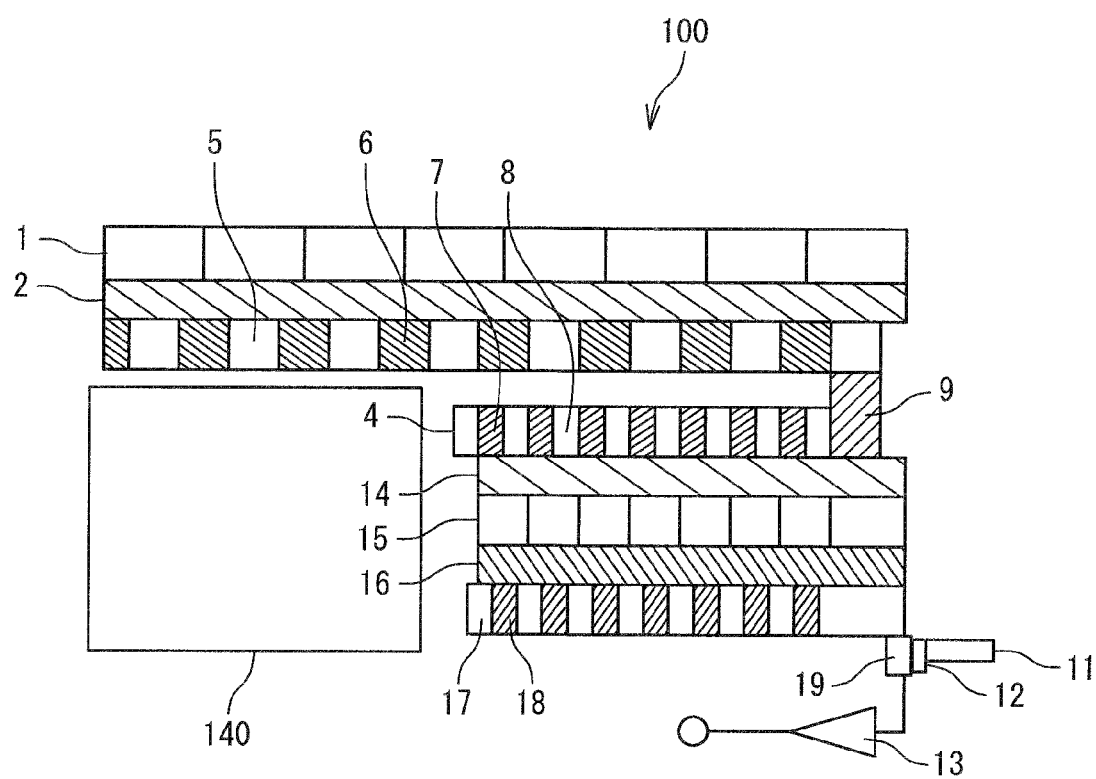
FIG. 24 is a diagram showing an example in which a space is prepared by narrowing pitches without varying the number of stages in second and third CCDs and memory regions.

In addition, a space is prepared by narrowing the pitch without varying the number of stages of the memory regions and second and third electric charge transfer sections, and arranging pads or the like therein, thereby performing a chip shrink so as to reduce a cost. FIG. 24 shows an example in which a space 140 is prepared by narrowing the pitches without varying the number of stages in the second electric charge transfer section 120 (the transfer electrodes 7 and the transfer electrodes 8), the third electric charge transfer section 130 (the transfer electrodes 17 and the transfer electrodes 18) and the memory regions 15. A chip shrink is possible by disposing pads in the space 140. That is to say, the space 140 can be used for a region where a power source is arranged, for example.

Figure 25:
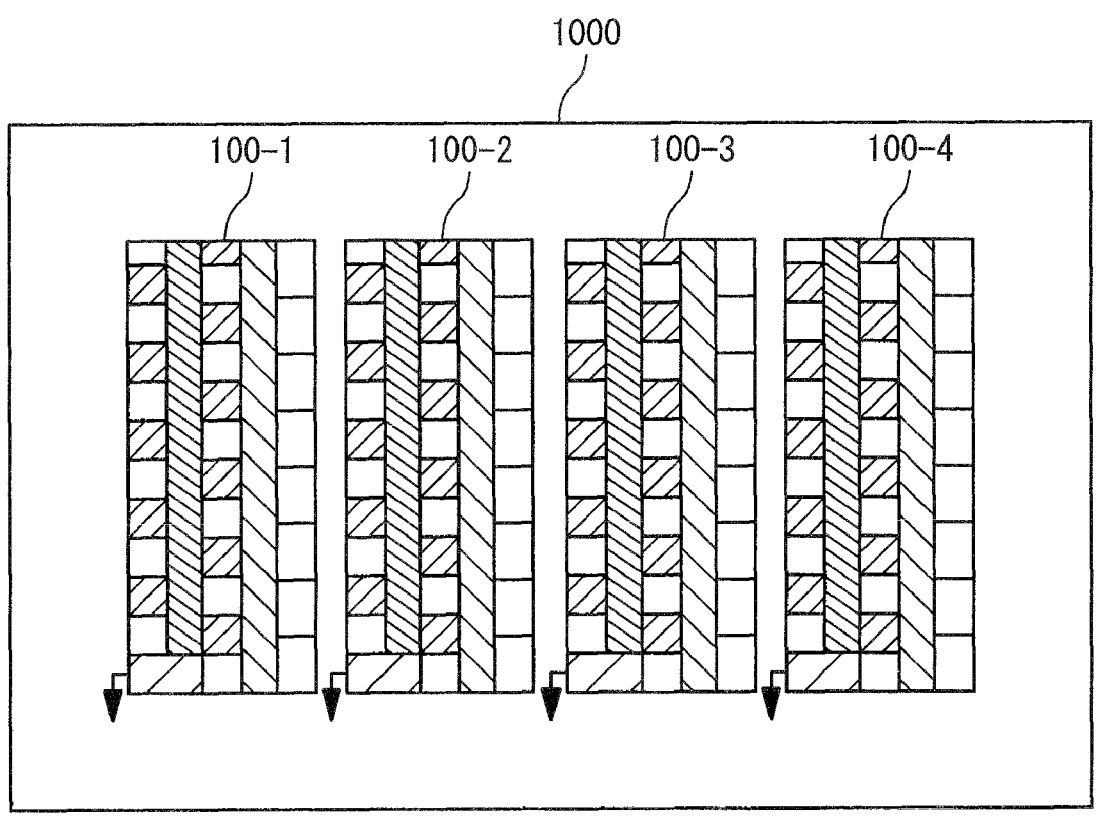
FIG. 25 is a diagram schematically showing a module having a plurality of solid imaging devices aligned in one line.

It should be noted that the present invention is applicable to a system such as a CIS using a plurality of solid imaging devices. For example, as illustrated in FIG. 25, a module 1000 can be fabricated which has a plurality of the solid imaging devices 100 (100-$i$, i=1 to n) according to the present invention aligned on one line. This module 1000 shows a solid imaging apparatus. It is considered that as the solid imaging apparatus, an image scanner, a copier, a combination machine, a FAX (facsimile) machine, a digital camera, a monitor camera, a USB camera, a mobile terminal with a camera function and other electronic devices with camera functions are exemplified.

Third Embodiment

Next, the solid imaging device according to a third embodiment of the present invention will be described below.

When the read period of the electric charges is elongated or a temperature becomes high, a dark current increases in the electric charge transfer section to possibly cause noise.

First of all, a description will be given on a dark current in the electric charge transfer section in case of no overflow drain section 4 in order to describe functions of the overflow drain section 4 in the first and second embodiments.

FIG. 26 is timing charts, and FIGS. 27A to 27E shows states of charges.

Figure 27A:
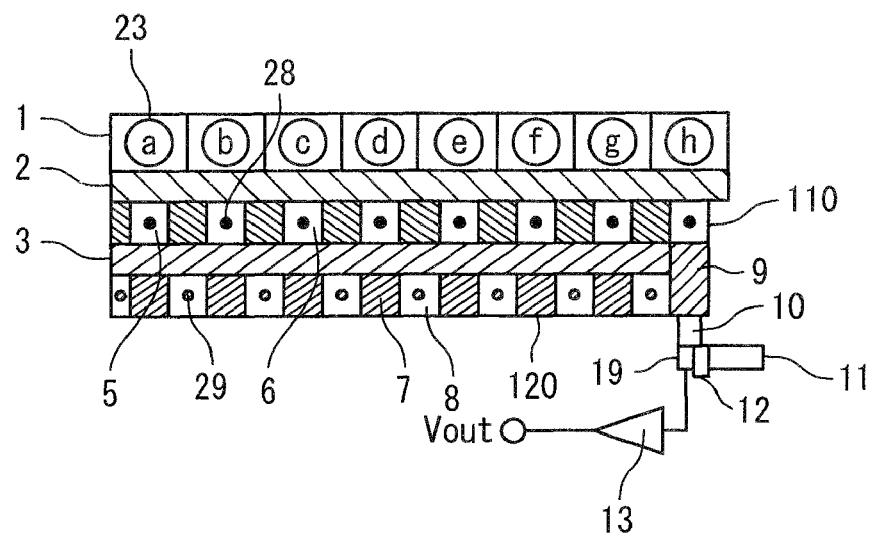
FIGS. 27A to 27E are diagrams showing an electric charge transferring process when the electric charges corresponding to the dark current are added in the first embodiment.

FIG. 27A corresponds to a period t0 in FIG. 26. Here, the transfer clock signals which are not currently used are stopped entirely so as to reduce current consumption. Therefore, in addition to electric charges 23 accumulated in the photodiodes 1 in the photoelectric converting section, electric charges corresponding to dark current 28 are accumulated in the first electric charge transfer section 110 including the transfer electrodes 5 and the transfer electrodes 6, while electric charges corresponding to dark current 29 are accumulated in the second electric charge transfer section 120 including the transfer electrodes 7 and the transfer electrodes 8. That is to say, in this case, the first electric charge transfer section 110 accumulates the dark current 28. The second electric charge transfer section 120 accumulates the dark current 29.

Figure 27B:
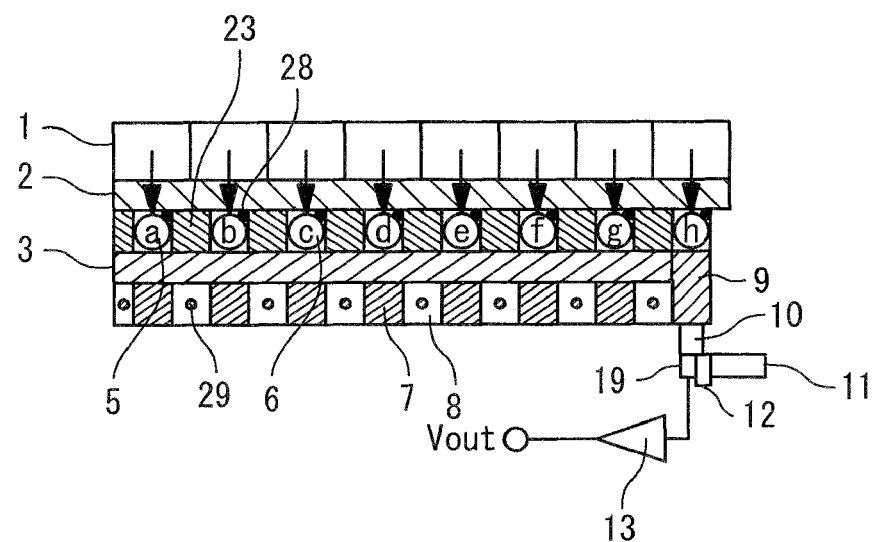

FIG. 27B corresponds to a period t1 in FIG. 26. Here, the electric charges 23 in the photodiodes 1 are coupled with the electric charges corresponding to the dark current 28 in the first electric charge transfer section 110 when the read gate electrode 2 is turned on in response to the transfer gate clock signal $\phi_{TG1}$. In other words, the read gate electrode 2 is turned on in response to the transfer gate clock signal $\phi_{TG1}$ to couple the electric charges 23 in the photodiode 1 with the electric charges corresponding to the dark current 28 in the first electric charge transfer section 110.

Figure 27C:
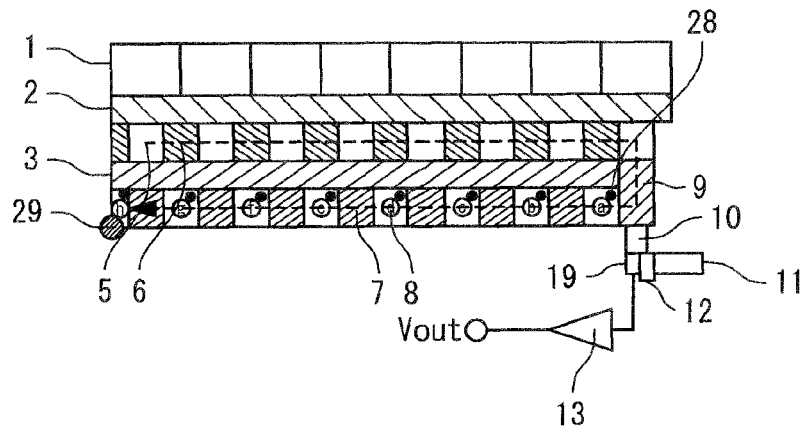

FIG. 27C corresponds to a period t2 in FIG. 26. Here, the transfer electrodes 5 are turned on (i.e., started) in response to the drive clock signal $\phi_1$. The transfer electrodes 6 are turned on (i.e., started) in response to the drive clock signal $\phi_2$. The electric charge coupling electrode 9 is turned on (i.e., started) in response to the modulation pulse $\phi_M$. The transfer electrodes 7 are turned on (i.e., started) in response to the drive clock signal $\phi_3$. The transfer electrodes 8 are turned on (i.e., started) in response to the drive clock signal $\phi_4$. When each of these electrodes is turned on (i.e., started), the electric charge 23 and the electric charges corresponding to the dark current 28 are transferred from the first electric charge transfer section 110 to the second electric charges transfer section 120. At this time, the electric charges corresponding to the dark current 29 originally accumulated in the second electric charge transfer section 120 is entirely transferred to the transfer electrodes 8 disposed in a last stage (the farthest side from the electric charge coupling electrode 9) and coupled with the electric charge 23 (i.e., electric charge h) in the last stage.

Figure 27D:
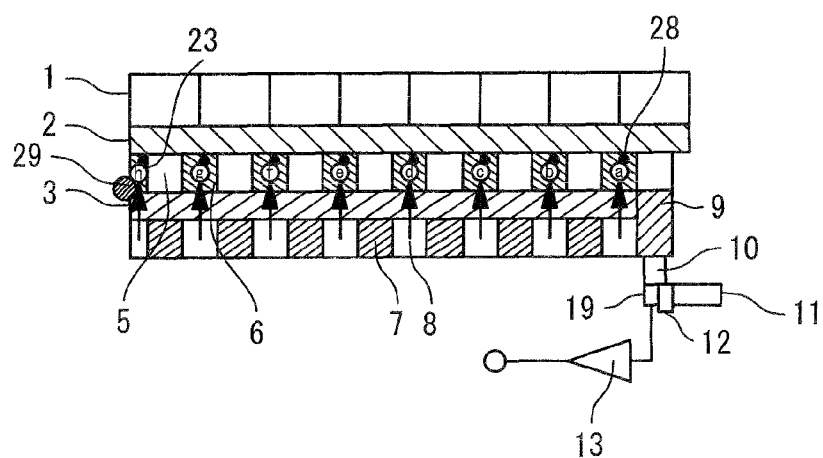

FIG. 27D corresponds to a period t3 in FIG. 26. Here, the electric charges 23 sent to the second electric charge transfer section 120 are sent to the first electric charge transfer section 110 when the transfer gate 3 is turned on in response to the transfer gate clock signal $\phi_{TG2}$. In other words, the transfer gate 3 is turned on in response to the transfer gate clock signal $\phi_{TG2}$ to send to the first electric charge transfer section 110, the electric charge 23 having been sent to the second electric charge transfer section 120.

Figure 27E:
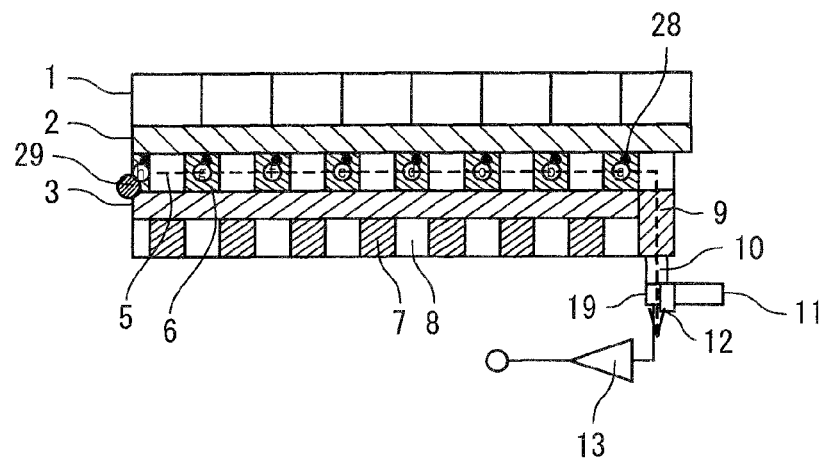

FIG. 27E corresponds to a period t4 in FIG. 26. Here, the transfer electrodes 5 are turned on in response to the drive clock signal $\phi_1$. The transfer electrodes 6 are turned on in response to the drive clock signal $\phi_2$. The electric charge coupling electrode 9 is turned on in response to the modulation pulse $\phi_M$. The transfer electrodes 7 are turned on in response to the drive clock signal $\phi_3$. The transfer electrodes 8 are turned on in response to the drive clock signal $\phi_4$. The last gate electrode 10 is turned on (i.e., started) in response to a last clock $\phi_L$. The reset gate electrode 12 is turned on in response to the reset pulse $\phi_R$. When each of these electrodes is turned on (i.e., started), the electric charges 23 accumulated in the first electric charge transfer section 110 are transferred to the floating diffusion capacitance section 19. The floating diffusion capacitance section 19 converts the electric charge 23 into a voltage. The amplifier 13 amplifies the voltage, and outputs Vout.

As shown as Vout in a period t4 of FIG. 26, the electric charges corresponding to the dark current 28 in the first electric charge transfer section 110 have been added to signals a to g. Furthermore, the electric charges corresponding to the entire dark currents 29 in the second electric charge transfer section 120 have been added to a signal h in the last stage, so the signal h is deteriorated due to the noise. Here, the signal h in the last stage expresses Vout obtained by converting the electric charge 23 (i.e., electric charge h) in the last stage into a voltage which is amplified.

<Improvement Method>

The overflow drain section 4 is provided to improve the above problem, and its specific method is illustrated in FIGS. 28 and 29A to 29F.

In the third embodiment, an addition transfer electrode 7a and a register drain 27 are provided at the end (a leftmost side) of the second electric charge transfer section 120 as the overflow drain section 4, and timings to discharge the electric charges corresponding to the dark current 28 in the first electric charge transfer section 110 are added. This register drain 27 is connected to a power supply (not illustrated) and has a deeper potential than a channel potential disposed below the electrodes of the second electric charge transfer section 120. The addition transfer electrode 7a also has a structure similar to that of the transfer electrode 7, and is turned on (i.e., started) in response to the drive clock signal $\phi_3$ in a same manner as the transfer electrode 7.

Figure 28:
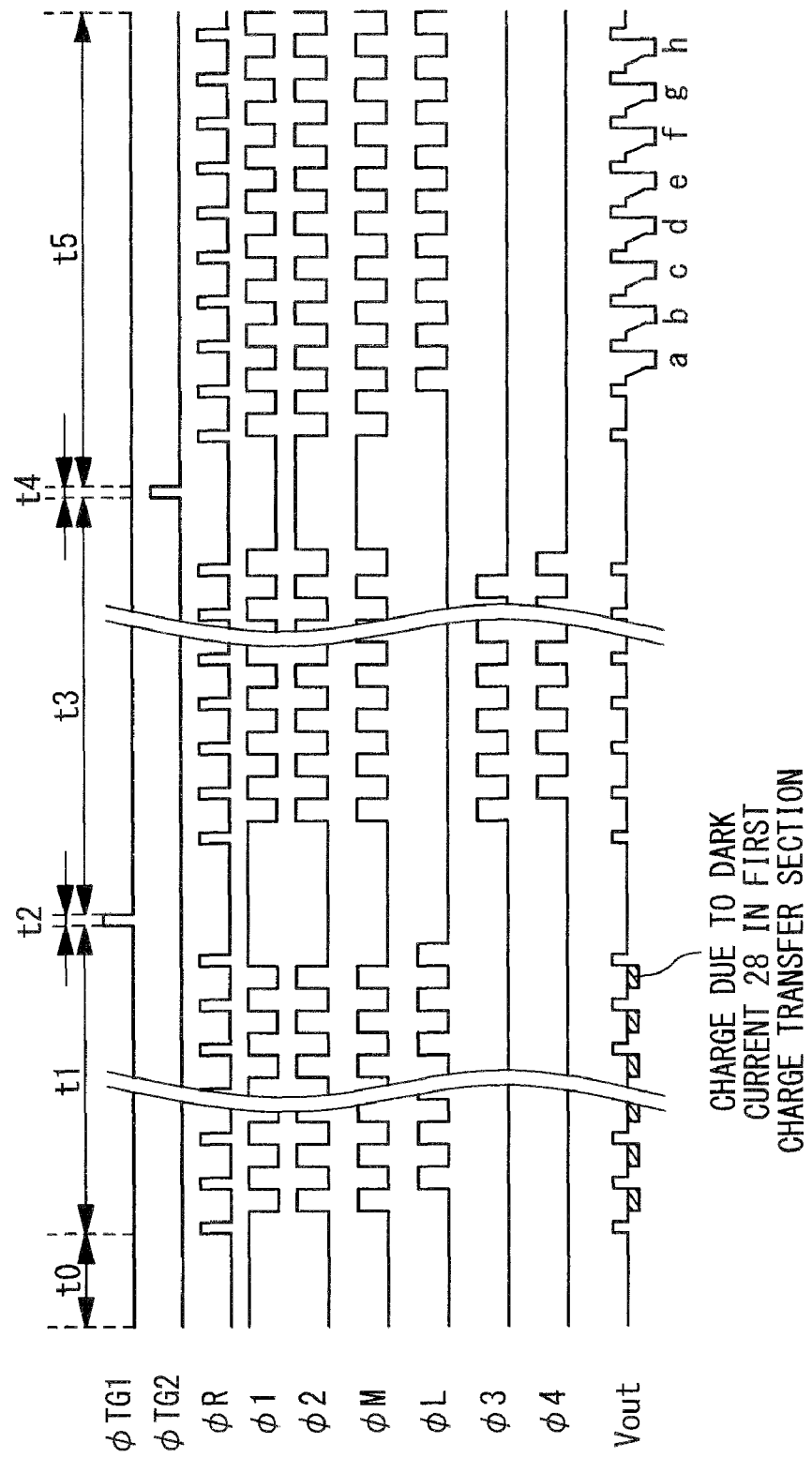
FIG. 28 shows timing charts in an operation example in the solid imaging device according to a third embodiment of the present invention.
Figure 29A:
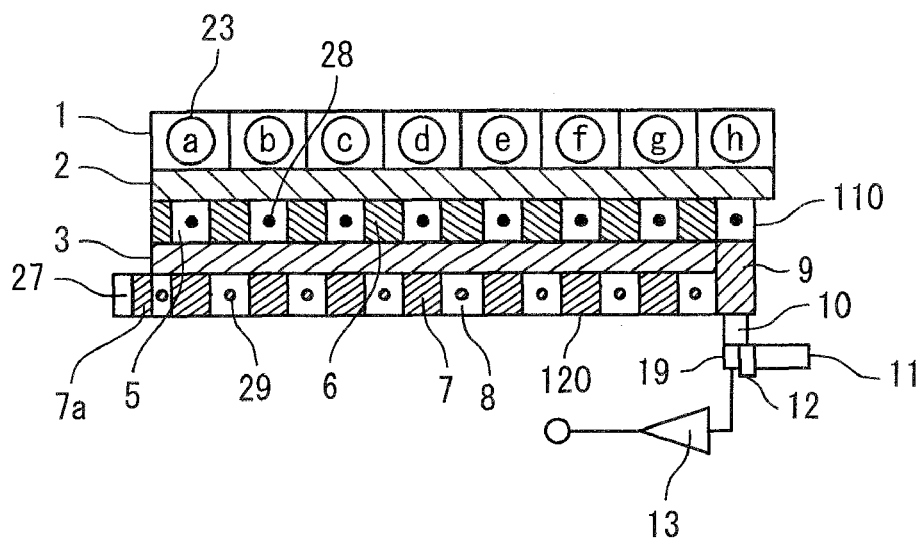
FIGS. 29A to 29F are diagrams showing an electric charge transferring process in the third embodiment.

FIG. 29A corresponds to a period t0 in FIG. 28. Here, the transfer clock signals which are not used are stopped entirely to reduce current consumption. Therefore, in addition to the electric charges 23 accumulated in the photodiodes 1, the electric charges corresponding to the dark current 28 are accumulated in the first electric charge transfer section 110 including the transfer electrodes 5 and the transfer electrodes 6, while the electric charges corresponding to the dark current 29 are accumulated in the second electric charge transfer section 120 including the transfer electrodes 7 and the transfer electrodes 8. That is to say, in this case, the first electric charge transfer section 110 accumulates the electric charges corresponding to the dark current 28. The second electric charge transfer section 120 accumulates the electric charges corresponding to the dark current 29.

Figure 29B:
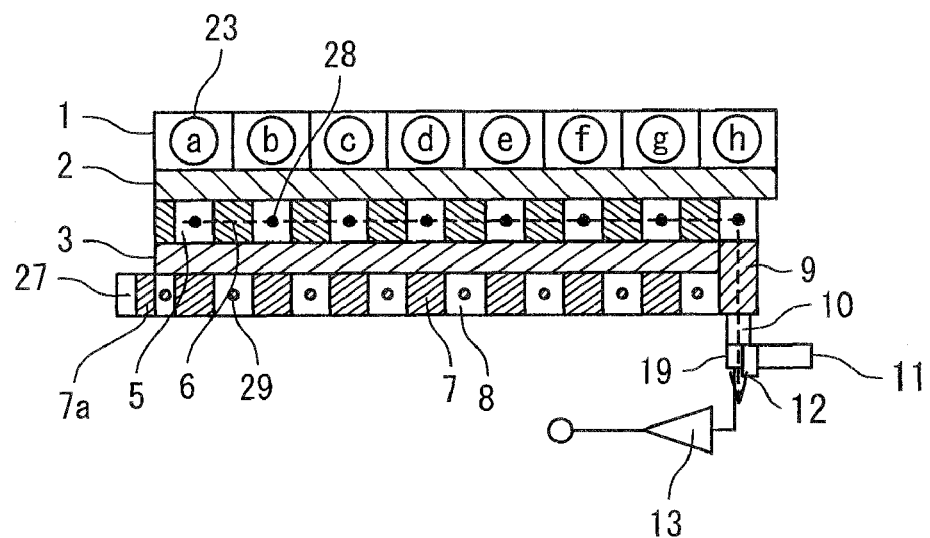

FIG. 29B corresponds to a period t1 in FIG. 28. Here, the transfer electrodes 5 are turned on in response to the drive clock signal $\phi_1$. The transfer electrodes 6 are turned on in response to the drive clock signal $\phi_2$. The electric charge coupling electrode 9 is turned on in response to the modulation pulse $\phi_M$. The last gate electrode 10 is turned on in response to the last clock $\phi_L$. The reset gate electrode 12 is turned on in response to the reset pulse $\phi_R$. When each of these electrodes is turned on, the electric charges corresponding to the dark current 28 accumulated in the first electric charge transfer section 110 are outputted to Vout. More specifically, when each of these electrodes is turned on, the electric charges corresponding to the dark current 28 accumulated in the first electric charge transfer section 110 are sent to the floating diffusion capacitance section 19. The floating diffusion capacitance section 19 converts the electric charges corresponding to the dark current 28 into a voltage. The amplifier 13 amplifies the voltage, and outputs Vout.

Data is not captured at this time, and therefore adverse effects are not observed.

Figure 29C:
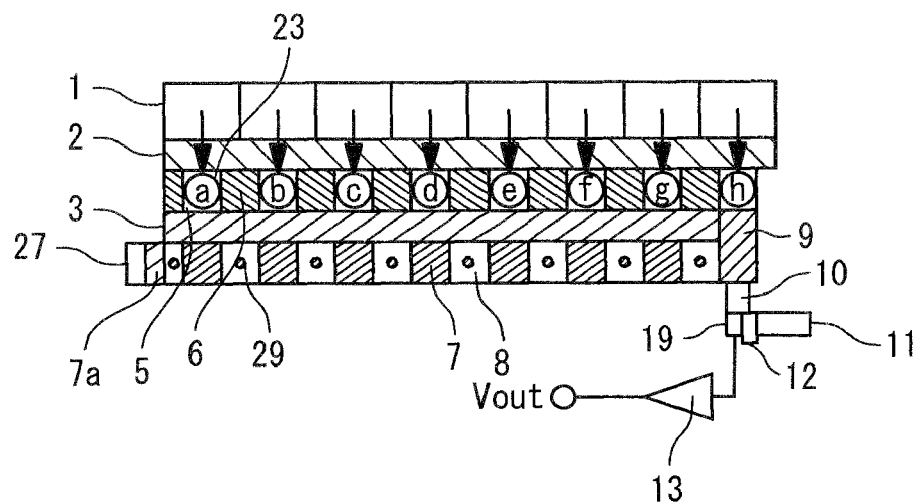

FIG. 29C corresponds to a period t2 in FIG. 28. Here, the electric charges 23 in the photodiodes 1 are transferred to the first electric charge transfer section 110 when the read gate electrode 2 is turned on in response to the transfer gate clock signal $\phi_{TG1}$. In other words, the read gate electrode 2 is turned on in response to the transfer gate clock signal $\phi_{TG1}$ to transfer the electric charges 23 in the photodiodes 1 to the first electric charge transfer section 110.

Figure 29D:
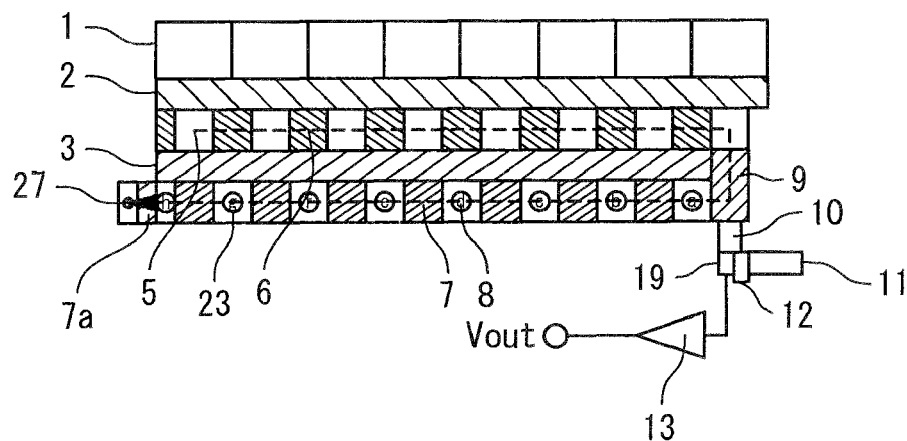

FIG. 29D corresponds to a period t3 in FIG. 28. Here, the transfer electrodes 5 are turned on in response to the drive clock signal $\phi_1$. The transfer electrodes 6 are turned on in response to the drive clock signal $\phi_2$. The electric charge coupling electrode 9 is turned on in response to the modulation clock signal $\phi_M$. The transfer electrodes 7 and the addition transfer electrode 7a are turned on in response to the drive clock signal $\phi_3$. The transfer electrodes 8 are turned on in response to the drive clock signal $\phi_4$. When each of these electrodes is turned on, the electric charges 23 are transferred from the first electric charge transfer section 110 to the second electric charges transfer section 120. At this time, the electric charges corresponding to the dark current 29 generated in the second electric charge transfer section 120 are discharged to the register drain 27 formed at the end via the addition transfer electrode 7a. In other words, the second electric charge transfer section 120 discharges the electric charges corresponding to the dark current 29 accumulated therein to the register drain 27 formed at the end when the electric charges 23 transferred from the first electric charge transfer section 110 to the second electric charge transfer section 120.

Figure 29E:
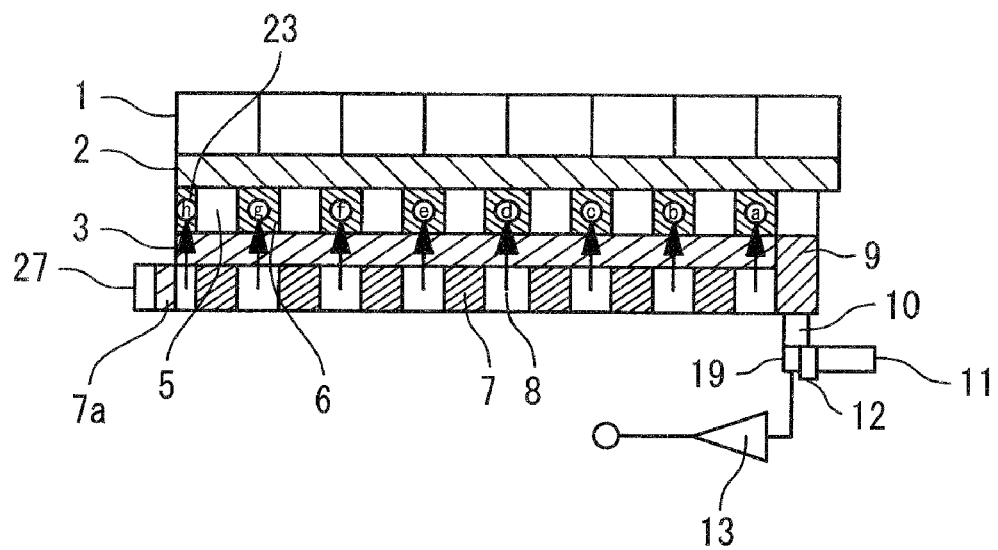

FIG. 29E corresponds to a period t4 in FIG. 28. Here, the electric charges 23 having been sent to the second electric charge transfer section 120 are sent to the first electric charge transfer section 110 when the transfer gate 3 is turned on in response to the transfer gate clock signal $\phi_{TG2}$. In other words, when the transfer gate 3 is turned on in response to the transfer gate clock signal $\phi_{TG2}$, the electric charges 23 are sent from the second electric charge transfer section 120 to the first electric charge transfer section 110.

Figure 29F:
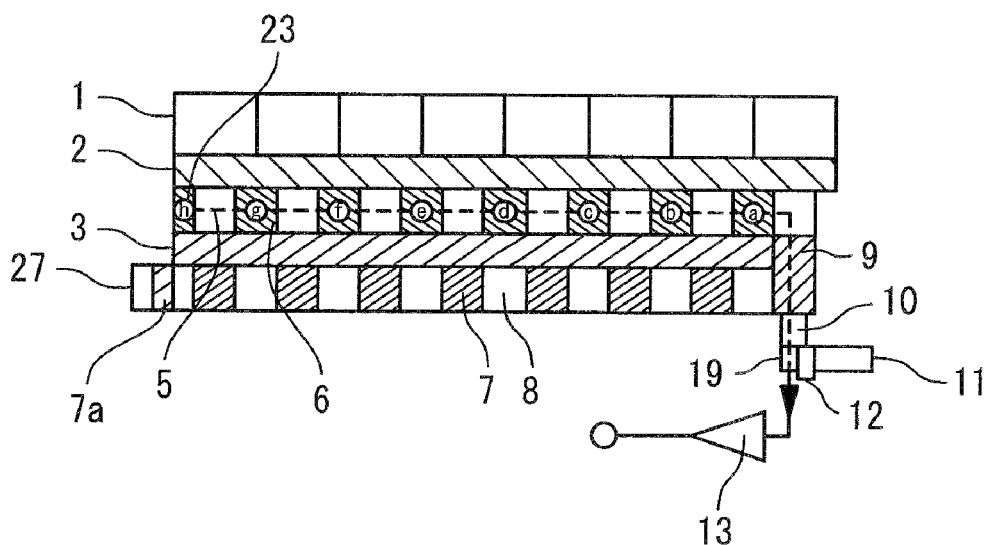

FIG. 29F corresponds to a period t5 in FIG. 28. Here, the transfer electrodes 5 are turned on in response to the drive clock signal $\phi_1$. The transfer electrodes 6 are turned on in response to the drive clock signal $\phi_2$. The electric charge coupling electrode 9 is turned on in response to the modulation pulse $\phi_M$. The last gate electrode 10 is turned on in response to the last clock $\phi_L$. The reset gate electrode 12 is turned on in response to the reset pulse $\phi_R$. When each of these electrodes is turned on, the electric charges 23 accumulated in the first electric charge transfer section 110 are sent to the floating diffusion capacitance section 19. The floating diffusion capacitance section 19 converts the electric charges 23 into voltages. The amplifier 13 amplifies the voltage, and outputs Vout.

As shown as Vout in the period t5 in FIG. 28, the electric charges corresponding to the dark current 29 are not loaded onto a signal because they are discharged to the register drain 27.

With regard to the discharge of the electric charges corresponding to the dark current 28 in the first electric charge transfer section 110, the timings in the period t1 of FIG. 28 may be omitted as long as there are no effects or influences to consider.

Similar measures can be also applied to the second embodiment, though it is not described.

In this way, the solid imaging apparatus of the present embodiment is characterized by providing the resister drain at an end of the second electric charge transfer section in order to absorb the electric charges.

Fourth Embodiment

The solid imaging apparatus according to a fourth embodiment of the present invention will be described below.

FIG. 30 and FIGS. 31A to 31F illustrate another improvement method. Main differences from the third embodiment are in the increase in the number of electrodes (as illustrated by one stage in the drawings) in each of the first electric charge transfer section 110, which includes the transfer electrodes 5 and the transfer electrodes 6, and the second electric charge transfer section 120, which includes the transfer electrodes 7 and the transfer electrodes 8, and a timing added to discharge the electric charges corresponding to the dark current 29 in the second electric charge transfer section 120. That is to say, the number of electrodes in each of the first electric charge transfer section 110 and the number of the electrodes in the second electric charge transfer section 120 is increased more by one than the number of pixels in the photodiodes 1.

FIGS. 31A to 31F illustrate an example of adding one stage, wherein an addition transfer electrode 5a and an addition transfer electrode 6a are arranged on a leftmost side of the first electric charge transfer section 110, and an addition transfer electrode 7a and an addition transfer electrode 8a are arranged on a leftmost side of the second electric charge transfer section 120. The addition transfer electrode 5a has a structure similar to that of the transfer electrode 5, and is turned on in response to the drive clock signal $\phi_1$ in the same manner as the transfer electrode 5. The addition transfer electrode 6a has a structure similar to that of the transfer electrode 6, and is turned on in response to the drive clock signal $\phi_2$ in the same manner as the transfer electrode 6. The addition transfer electrode 7a has a structure similar to that of the transfer electrode 7, and is turned on in response to the drive clock signal $\phi_3$ in the same manner as the transfer electrode 7. The addition transfer electrode 8a has a structure similar to that of the transfer electrode 8, and is turned on in response to the drive clock signal $\phi_4$ in the same manner as the transfer electrode 8. The addition transfer electrode 8a is not connected to a power supply, which differs from the register drain 27 in the third embodiment.

Figure 30:
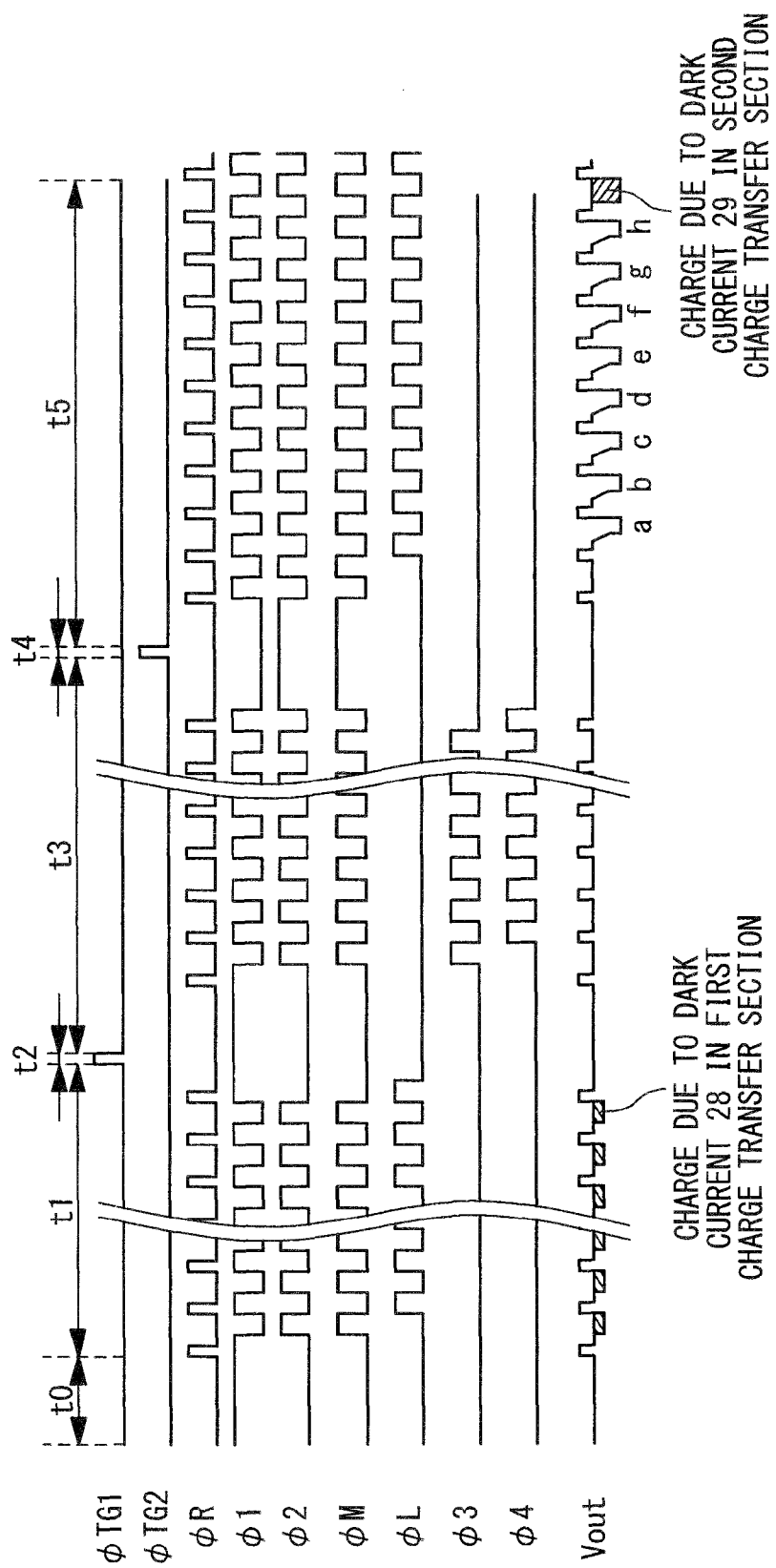
FIG. 30 shows timing charts showing an operation of the solid imaging device according to a fourth embodiment of the present invention.
Figure 31A:
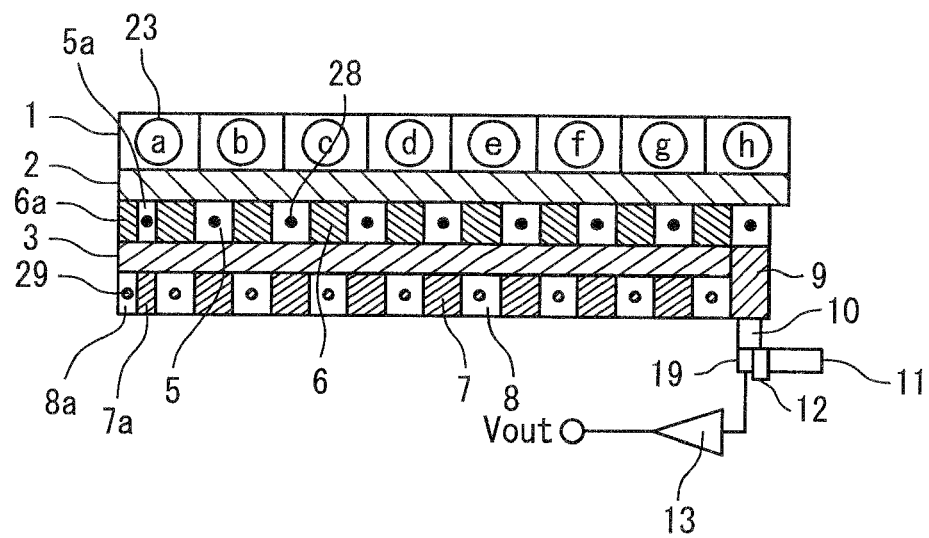
FIGS. 31A to 31F are diagrams showing an electric charge transferring process in the fourth embodiment.

FIG. 31A corresponds to a period t0 in FIG. 30. Here, the transfer clock signals which are not used are stopped entirely to reduce current consumption. Therefore, in addition to the electric charges 23 accumulated in the photodiodes 1 in the photoelectric converting section, the electric charges corresponding to the dark current 28 are accumulated in the first electric charge transfer section 110 including the transfer electrodes 5 and the transfer electrodes 6 as well as the addition transfer electrode 5a and the addition transfer electrode 6a, while the electric charges corresponding to the dark current 29 are accumulated in the second electric charge transfer section 120 including the transfer electrodes 7 and the transfer electrodes 8 as well as the addition transfer electrode 7a and the addition transfer electrode 8a. That is to say, in this case, the first electric charge transfer section 110 accumulates the electric charges corresponding to the dark current 28. The second electric charge transfer section 120 accumulates the electric charges corresponding to the dark current 29.

Figure 31B:
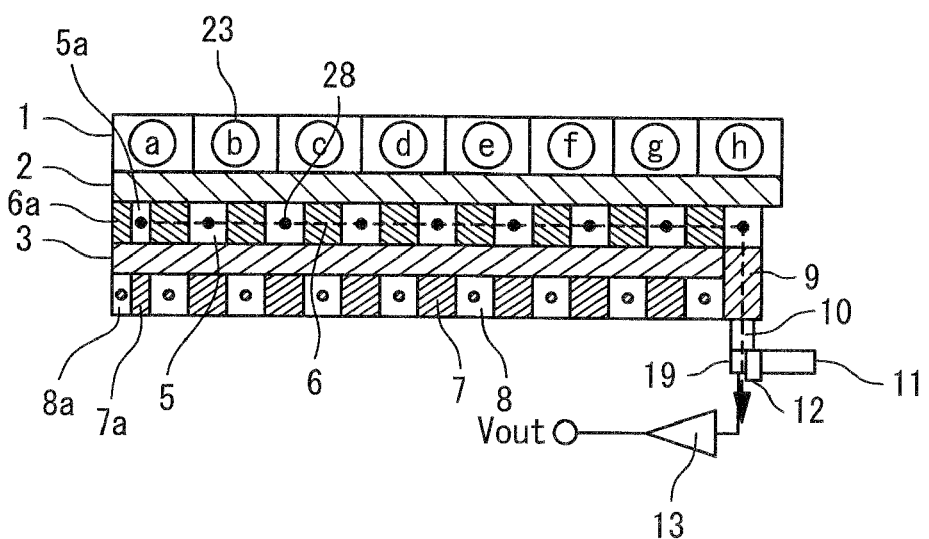

FIG. 31B corresponds to a period t1 of FIG. 30. Here, the transfer electrodes 5 and the addition transfer electrode 5a are turned on in response to the drive clock signal $\phi_1$. The transfer electrodes 6 and the addition transfer electrode 6a are turned on in response to the drive clock signal $\phi_2$. The electric charge coupling electrode 9 is turned on in response to the modulation pulse $\phi_M$. The last gate electrode 10 is turned on in response to the last clock $\phi_L$. The reset gate electrode 12 is turned on in response to the reset pulse $\phi_R$. When each of these electrodes is turned on, the electric charges corresponding to the dark current 28 having been accumulated in the first electric charge transfer section 110 are outputted to Vout. In other words, when each of these electrodes is turned on, the electric charges corresponding to the dark current 28 having been accumulated in the first electric charge transfer section 110 are sent to the floating diffusion capacitance section 19. The floating diffusion capacitance section 19 converts the electric charges corresponding to the dark current 28 into voltages. The amplifier 13 amplifies the voltage, and outputs Vout. Data is not captured at this time, and therefore adverse effects are not observed.

Figure 31C:
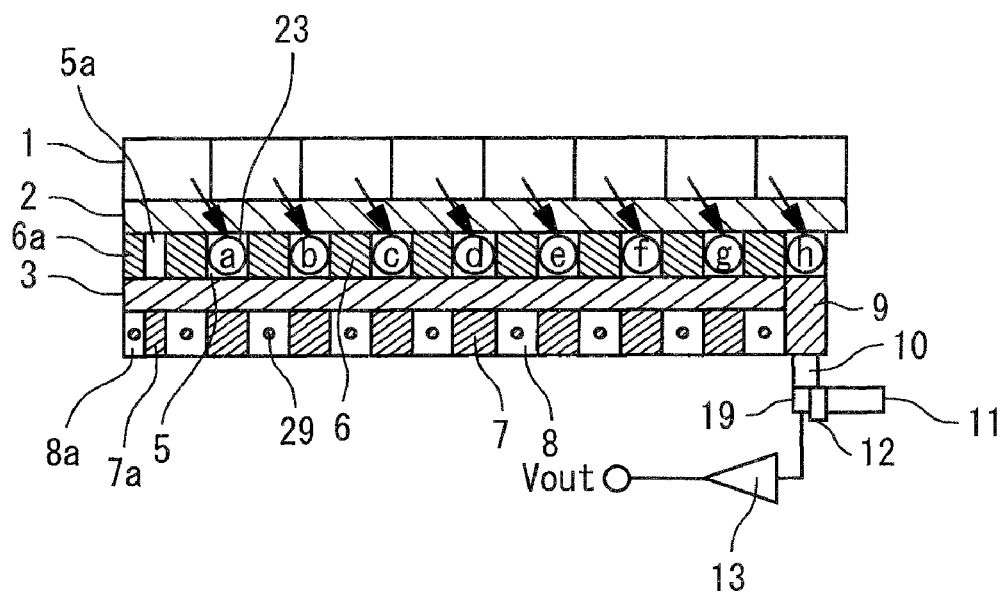

FIG. 31C corresponds to a period t2 in FIG. 30. Here, the electric charges 23 in the photodiodes 1 are transferred to the transfer electrodes 5 in the first electric charge transfer section 110 when the read gate electrode 2 is turned on in response to the transfer gate clock signal $\phi_{TG1}$. In other words, the read gate electrode 2 is turned on in response to the transfer gate clock signal $\phi_{TG1}$ to transfer the electric charges 23 in the photodiodes 1 to the first electric charge transfer section 110.

Figure 31D:
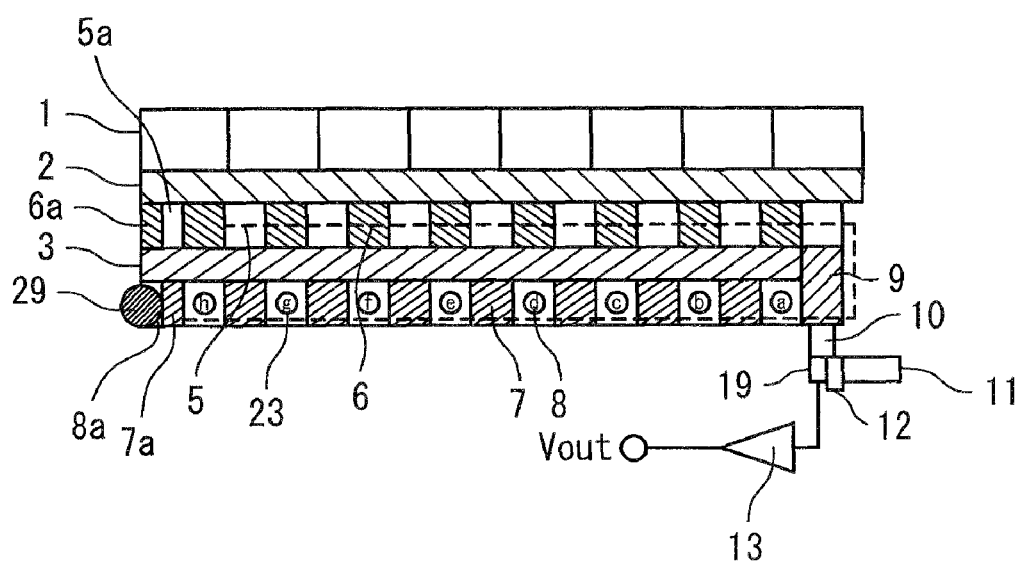

FIG. 31D corresponds to a period t3 in FIG. 30. Here, the transfer electrodes 5 and the addition transfer electrode 5a are turned on in response to the drive clock signal $\phi_1$. The transfer electrodes 6 and the addition transfer electrode 6a are turned on in response to the drive clock signal $\phi_2$. The electric charge coupling electrode 9 is turned on in response to the modulation pulse $\phi_M$. The transfer electrodes 7 and the addition transfer electrode 7a are turned on in response to the drive clock signal $\phi_3$. The transfer electrodes 8 and the addition transfer electrode 8a are turned on in response to the drive clock signal $\phi_4$. When each of these electrodes is turned on, the electric charges 23 are transferred from the first electric charge transfer section 110 to the second electric charges transfer section 120. At this time, the electric charges corresponding to the dark current 29 generated in the second electric charge transfer section 120 are accumulated in the resister in the last stage (i.e., the addition transfer electrode 8a) which is formed by adding one stage, whereby it is not combined with the electric charge h of the electric charges 23.

Figure 31E:
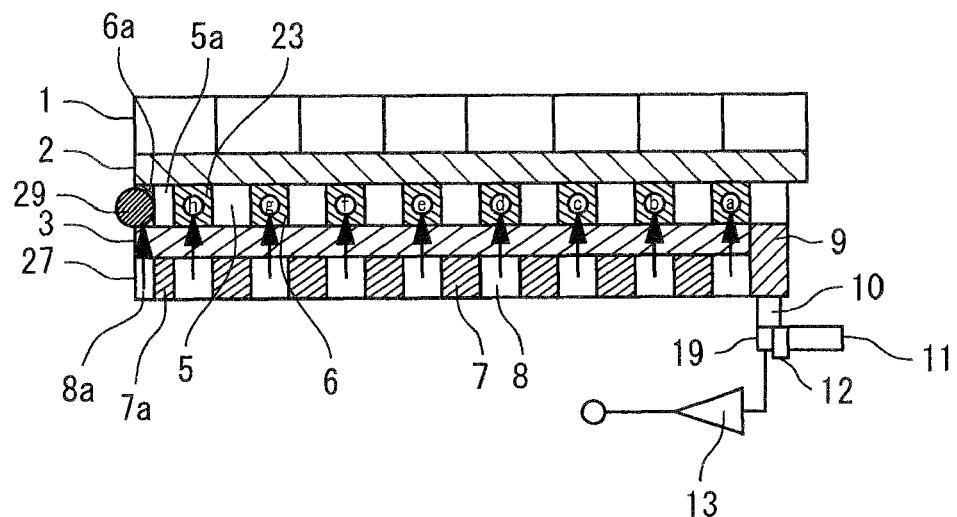

FIG. 31E corresponds to a period t4 in FIG. 30. Here, the electric charges 23 having been sent to the second electric charge transfer section 120 are sent to the first electric charge transfer section 110 when the transfer gate 3 operates in response to the transfer gate clock signal $\phi_{TG2}$. In other words, the transfer gate 3 is turned on in response to the transfer gate clock signal $\phi_{TG2}$, the electric charges 23 are sent from the second electric charge transfer section 120 to the first electric charge transfer section 110.

Figure 31F:
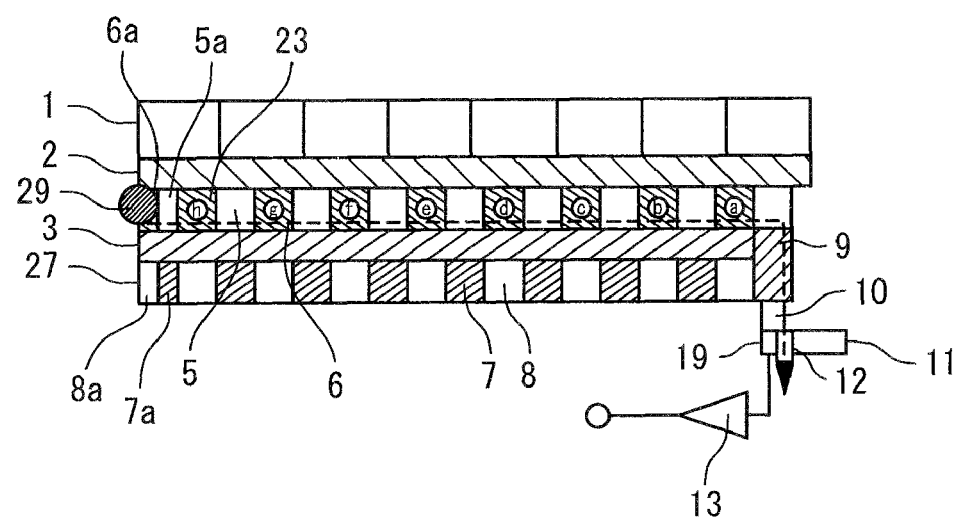

FIG. 31F corresponds to a period t5 in FIG. 30. Here, the transfer electrodes 5 and the addition transfer electrode 5a are turned on in response to the drive clock signal $\phi_1$. The transfer electrodes 6 and the addition transfer electrode 6a are turned on in response to the drive clock signal $\phi_2$. The electric charge coupling electrode 9 is turned on in response to the modulation clock signal $\phi_M$. The last gate electrode 10 is turned on in response to the last clock signal $\phi_L$. The reset gate electrode 12 is turned on in response to the reset pulse $\phi_R$. When each of these electrodes is turned on, the electric charges 23 having been accumulated in the first electric charge transfer section 110 are sent to the floating diffusion capacitance section 19. The floating diffusion capacitance section 19 converts the electric charges 23 into voltages. The amplifier 13 amplifies the voltage, and outputs Vout.

As indicated by Vout in the period t5 in FIG. 30, the electric charges corresponding to the dark current 29 are outputted following to the last signal h. After the signals a to h are captured, the signal corresponding to the dark current 29 are prevented from being captured. Although a period of one clock is added to output the electric charges corresponding to the dark current 29, it is not necessary to add a power supply exclusively used for discharging the electric charges corresponding to the dark current 29. Also, the reset gate electrode 12 and the reset drain 11 can be used commonly, so that there is a merit to realize structural reduction in the solid imaging device. Here, the signals a to h denote Vout obtained by converting the electric charges a to h into voltages and amplifying them.

With regard to the discharge of the electric charges corresponding to the dark current 28 of the first electric charge transfer section 110, the timings in the period t1 of FIG. 30 may be omitted as long as there are no effects to consider. Also, similar measures can be also applied to the second embodiment, though it is not described.

If the present embodiment is adapted in the second embodiment, the number of the electrodes in the second electric charge transfer section 120, the number of the electrodes in the third electric charge transfer section 130, and the number of stages of the memory regions 15 are set to exceed the number of pixels in the photodiodes 1.

Furthermore, if it is difficult to achieve the structures as described in the third and the fourth embodiments, reduction of dark current effects can also be expected by turning on the read gate electrode 3 in the period to of FIG. 26 to couple the electric charges corresponding to the dark current 28 in the first electric charge transfer section 110 with the electric charges corresponding to the dark current 29 in the second electric charge transfer section 120, and then by adding timings to output to Vout through drive of the first electric charge transfer section 110.

In this way, the solid imaging device of the present embodiment is characterized in that the number of the electrodes in each of the first electric charge transfer section and second electric charge transfer section exceed the number of photodiodes 1. Also, the solid imaging device of the present embodiment is also characterized in that the number of the electrodes in each of the second electric charge transfer section and the third electric charge transfer section and the number of stages in the electric charge accumulating section exceed the number of photodiodes 1, if the third electric charge transfer section and the electric charge accumulating section are provided. At this time, the solid imaging device of the present embodiment may use as a region to arrange elements, a space prepared by narrowing a pitch without changing the number of stages in each of the second electric charge transfer section, the third electric charge transfer section and the electric charge accumulating section.

Finally, effects of the present invention are concluded below.

As described above, the solid imaging device according to the present invention includes the photoelectric converting section and is connected to the electric charge transfer section via the photoelectric converting section and the read gate section. The solid imaging device is connected to another independently driven electric charge transfer section via the electric charge transfer section and the electric charge coupling electrode. The read gate may be interposed between the two electric charge transfer sections in order to transfer electric charges from one of the electric charge transfer sections to the other. Alternatively, the output electrode may be connected to the electric charge coupling electrode, and further, a floating diffusion capacitance, an electric charge detecting section, a reset gate and a reset drain may be also formed to be connected to of the output electrode. Otherwise, the electric charge accumulating section may be formed in the electric charge transfer section via the read gate electrode, and may be connected to the electric charge transfer section via the read gate electrode. Or, the output electrode may be connected to the last stage of the electric charge transfer section, and further, the floating diffusion capacitance, the electric charge detecting section, the reset gate and the reset drain may be formed to be connected to the output electrode. Alternatively, pitches of the second electric charge transfer section, the electric charge accumulating section and the third electric charge transfer section may be defined more narrowly than that of the first electric charge transfer section.

In other words, the solid imaging device according to the present invention has at least two independent electric charge transfer sections. In the solid imaging device according to the present invention, the two electric charge transfer sections are connected via the electric charge coupling electrode along a transfer direction, in which electric charges outputted from the photoelectric converting section are received by a first one of the two electric charge transfer sections, and the electric charges received by the first electric charge transfer section are coupled by reducing a transfer speed of a second one of the two electric charge transfer sections in accordance with a resolution. After adding or coupling the electric charges, the electric charges are transferred from the second electric charge transfer section to the first electric charge transfer section by the read gate electrode interposed between the two electric charge transfer sections, and outputted through the last gate connected to the electric charge coupling electrode. An operation to couple the electric charges is carried out before output of signals, which does not require any changes made in the data rate and the increase in the transfer speed. Thus, the present invention can carry out signal output in an optional resolution without increasing the transfer speed and varying the data rate in the solid imaging device.

It should be noted that the solid imaging apparatus using a plurality of the solid imaging devices according to the present invention can be devised as an application technique of the present invention.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A solid imaging device comprising:
   a photoelectric converting section configured to generate electric charges through photoelectric conversion, the photoelectric converting section having an upper surface and a lower surface;
   a first charge transfer section connected with said photoelectric converting section, individual elements of said first charge transfer section being located between an upper surface of the first charge transfer section facing the lower surface of the photoelectric converting section;
   a first read gate section provided between said photoelectric converting section and said first charge transfer section, an upper surface of said first read gate section being adjacent the lower surface of the photoelectric converting section and a lower surface of said first read gate being adjacent the upper surface of the first charge transfer section, with the individual elements of said first charge transfer section being in vertical registration with corresponding individual elements of said photoelectric converting section, the first read gate section configured to parallel transfer the electric charges from said photoelectric converting section to said first charge transfer section, the electric charges being transferred from each individual element of said photoelectric converting section into each corresponding individual element of said first charge transfer section; and
   a second charge transfer section operating independently from said first charge transfer section and configured to receive the electric charges from the individual elements of the said first charge transfer section, the electric charges transferred serially from and through one individual element of said first charge transfer section into and through one element of the second charge transfer section, an upper surface of said second charge transfer section being below the lower surface of the first charge transfer section, with individual elements of said second charge transfer section being in vertical registration with corresponding individual elements of said first charge transfer sections.

2. The solid imaging device according to claim 1, further comprising:
   a charge coupling electrode provided at an output end of said first charge transfer section, and configured to serially transfer each of the electric charges from said output end through said one individual element of said first charge transfer section to said one element of said second charge transfer section.

3. The solid imaging device according to claim 2, further comprising:
   an output electrode connected with said charge coupling electrode to output said electric charges from said output end of said first charge transfer section into said output electrode,
   a floating diffusion capacitance section connected to said output electrode,
   a charge detecting section connected to said floating diffusion capacitance section,
   a reset gate connected to said floating diffusion capacitance section, and
   a reset drain connected to said reset gate.

4. The solid imaging device according to claim 1, wherein said second charge transfer section is supplied with a second charge transfer clock signal which is determined based on a first charge transfer clock signal to be supplied to said first charge transfer section.

5. The solid imaging device according to claim 4, further comprising:
   a clock generating circuit configured to selectively supply the second charge transfer clock signal to said second charge transfer section based on a resolution.

6. The solid imaging device according to claim 1, further comprising:
   a second read gate section provided between said first charge transfer section and said second charge transfer section, an upper surface of second read gate section being adjacent the lower surface of the first charge transfer section, and a lower surface of said second read gate section being adjacent the upper surface of the second charge transfer section so that said second read gate section is located between the individual elements of the first and second charge transfer sections, said second read gate section configured to parallel transfer of the electric charges from each individual element of said second charge transfer section to each corresponding individual element of said first charge transfer section.

7. The solid imaging device according to claim 1, wherein a number of electrodes in said first charge transfer section and a number of electrodes are more than a number of pixels in said photoelectric converting section.

8. The solid imaging device according to claim 1, further comprising:
a register drain provided at an end of said second charge transfer section to absorb the electric charge.

9. A solid imaging apparatus comprising a plurality of said solid imaging devices of claim 1.

10. The solid imaging apparatus according to claim 9, wherein said solid imaging device further comprises:
a charge coupling electrode provided at an output of said first charge transfer section, and configured to transfer the electric charges from said first charge transfer section to said second charge transfer section.

11. The solid imaging apparatus according to claim 10, wherein said solid imaging device further comprises:
an output electrode connected with said charge coupling electrode, a floating diffusion capacitance section, a charge detecting section, a reset gate and a reset drain connected in order to said output electrode.

12. The solid imaging apparatus according to claim 9, wherein said second charge transfer section is supplied with a second charge transfer clock signal which is determined based on a first charge transfer clock signal to be supplied to said first charge transfer section.

13. A solid imaging device comprising:
a photoelectric converting section configured to generate electric charges through photoelectric conversion;
a first charge transfer section connected with said photoelectric converting section;
a first read gate section provided between said photoelectric converting section and said first charge transfer section, and configured to transfer the electric charges from said photoelectric converting section to said first charge transfer section;
a second charge transfer section operating independently from said first charge transfer section and configured to receive the electric charges transferred from said first charge transfer section;
a second read gate section provided between said first charge transfer section and said second charge transfer section, and configured to transfer the electric charges from said second charge transfer section to said first charge transfer section;
a charge accumulating section configured to accumulate the electric charge transferred from said second charge transfer section;
a third read gate provided between said second charge transfer section and said charge accumulating section and configured to transfer the electric charge from said second charge transfer section to said charge accumulating section;

a third charge transfer section operating independently from said first and second charge transfer sections and connected to said charge accumulating section; and
a fourth read gate provided between said third charge transfer section and said charge accumulating section and configured to transfer the electric charge from said charge accumulating section to said third charge transfer section.

14. The solid imaging device according to claim 13, wherein an element arrangement region formed by narrowing pitches of said second charge transfer section, said third charge transfer section, and said charge accumulating section without changing a number of stages.

15. The solid imaging device according to claim 13, wherein a number of electrodes in said second charge transfer section, a number of electrodes in said third charge transfer section, and a number of stages in said charge accumulating section are more than a number of pixels in said photoelectric converting section.

16. A method of transferring electric charges in a solid imaging device, comprising:
generating electric charges through photoelectric conversion in a photoelectric converting section;
transferring the electric charges from the photoelectric converting section to a first charge transfer section by the electric charges being parallel transferred from each individual element of the photoelectric converting section into each corresponding individual element of the first charge transfer section; and
transferring the electric charges from the first charge transfer section to a second charge transfer section which operates independently from the first charge transfer section by serial transfer from and through one individual element of said first charge transfer section into and through one element of the second charge transfer section.

17. The method according to claim 16, wherein the transferring the electric charges from the first charge transfer section to the second charge transfer section comprises:
transferring the electric charges from the first charge transfer section to the second charge transfer section via a charge coupling electrode provided at an output end side of the first charge transfer section.

18. The method according to claim 16, further comprising:
supplying a second charge transfer clock signal which is determined based on the first charge transfer clock signal to said second charge transfer section.

19. The method according to claim 18, wherein the second charge transfer clock signal is selected based on a resolution.

20. The method according to claim 16, further comprising:
transferring the electric charges from said second charge transfer section via a read gate provided between the first charge transfer section and the second charge transfer section by parallel transfer of the electric charges from each individual element of said second charge transfer section to each corresponding individual element of said first charge transfer section.

* * * * *